United States Patent [19]
Sato et al.

[11] Patent Number: 6,121,117
[45] Date of Patent: Sep. 19, 2000

[54] PROCESS FOR PRODUCING SEMICONDUCTOR SUBSTRATE BY HEAT TREATING

[75] Inventors: Nobuhiko Sato, Yokohama; Takao Yonehara; Kiyofumi Sakaguchi, both of Atsugi, all of Japan

[73] Assignee: Canon Kabushiki Kaisha, Tokyo, Japan

[21] Appl. No.: 09/118,872

[22] Filed: Jul. 20, 1998

Related U.S. Application Data

[62] Division of application No. 08/011,494, Jan. 29, 1993, abandoned.

[30] Foreign Application Priority Data

| Jan. 30, 1992 | [JP] | Japan | 4-038458 |
| Jan. 30, 1992 | [JP] | Japan | 4-038460 |
| Jan. 31, 1992 | [JP] | Japan | 4-016513 |
| Jan. 31, 1992 | [JP] | Japan | 4-016523 |
| Jan. 31, 1992 | [JP] | Japan | 4-016524 |

[51] Int. Cl.$^7$ ................................................. H01L 21/30
[52] U.S. Cl. ........................................... 438/459; 438/409
[58] Field of Search ............................. 438/149, 406, 438/459, 479, 408, 409, 974, 977

[56] References Cited

U.S. PATENT DOCUMENTS

| 3,929,529 | 12/1975 | Poponiak | 148/191 |
| 4,601,779 | 7/1986 | Abernathy et al. | 156/628 |
| 4,649,627 | 3/1987 | Abernethy et al. | 29/571 |
| 4,771,016 | 9/1988 | Bajor et al. | 437/180 |
| 4,826,787 | 5/1989 | Muto et al. | 437/247 |
| 5,089,441 | 2/1992 | Moslehi | 437/225 |
| 5,238,875 | 8/1993 | Ogino | 148/DIG. 12 |
| 5,371,037 | 12/1994 | Yonehara | 437/86 |
| 5,405,802 | 4/1995 | Yamagata et al. | 437/71 |
| 5,439,843 | 8/1995 | Sakaguchi et al. | 437/71 |
| 5,679,475 | 10/1997 | Yamagata et al. | 428/698 |

FOREIGN PATENT DOCUMENTS

| 0515181 | 11/1992 | European Pat. Off. . |
| 62-123098 | 6/1987 | Japan . |
| 1-183825 | 7/1989 | Japan . |
| 2-248051 | 10/1990 | Japan . |
| 3-42818 | 2/1991 | Japan . |

OTHER PUBLICATIONS

Cai, Tianhai, "Elimination of stacking faults in a silicon epitaxial layer of (100) orientation by heat treatment", Journal of Applied Physics, Jun. 1, 1990, USA, vol. 67, nr. 11, pp. 7176–7178.

Haisma, J., et al, "Silicon–on insulator wafer bonding–wafer thinning technological evaluations", Japanese Journal of Applied Physics, Part 1 (Regular Papers & Short Notes), 1989, Japan, vol. 28, nr. 8, pp. 1426–1443.

Ohukura A., et al., "The optimization of in–situ thermal cleaning focused on surface microroughness for future Si epitaxial growth", Extended Abstracts Of The 1991 International conference on Solid State Devices and Materials, Yokohama, Japan, Aug. 27–29, 1991, pp. 559–561.

(List continued on next page.)

*Primary Examiner*—Chandra Chaudhari
*Attorney, Agent, or Firm*—Fitzpatrick, Cella, Harper & Scinto

[57] ABSTRACT

A process for producing a semiconductor substrate comprises heat-treating a substrate having a monocrystal thereon in a reducing atmosphere.

175 Claims, 11 Drawing Sheets

OTHER PUBLICATIONS

Ungami et al., Structure of Porous Silicon Layer and Heat Treatment Effect, J. Electrochem. Soc. vol. 125, 8, 1339–1344, 1978.

Labunov et al., "Heat Treatment Effect on Porous Silicon", Thin Solid Films, vol. 137, 1, 123–134 (1986).

Takai et al., "Porous Silicon Layers and its Oxide for the Silicon–on–Insulator Structure". Appl. Phys. vol. 60, No. 1, Jul. 1986, pp. 222–225.

Bomchil et al., "Pore Size Distribution in Porous Silicon Studied by Adsorption", J. Electrochem. Soc. vol. 130, No. 7, p. 1611–1614, Jul. 1993.

Homstron et al., "Complete Dielectric Isolation by Highly Selective, etc." Appl. Phy. Ltrs., vol. 42, No. 4, p. 368–388, Feb. 2, 1993.

Imai, "A New Dielectric Isolation Method Using Porous Silicon", Solid State Electr., vol. 24, 1981, pp. 159–164.

Nakamura et al., "An Observation of 650° Deformation of Si", etc., J. Appl. Phys., vol. 68, No. 6, Sep. 1990, pp. 3038–3040.

Nakashima et al., "Surface Morphology of Oxygen–Implanted Wafters", J. Mater. Res., vol. 5, No. 9, Sep. 1990, pp. 1918–1928.

Uhlir, "Electrolyte Shaping of Germanium and Silicon", Bell Sys. Tech. Jour., vol. 35, 1956, pp. 333–347.

Unagami, "Formation Mechanism of Porous Silicon Layer", Jour. Electrochem. Soc., vol. 127, No. 2, Feb. 1980, pp. 476–483.

Cullen, Single Crystal Silicon on Non–Single Crystal Insulators, Jour. Crystal Growth, vol. 63, No. 3, Oct. 1983, pp. 429–590.

PROCESS FOR PRODUCING SEMICONDUCTOR SUBSTRATE BY HEAT TREATING

This application is a division of Ser. No. 08/011,494 filed Jan. 29, 1993, now abandoned.

BACKGROUND OF THE INVENTION

1. Field of the Invention

The present invention relates to a process for producing a semiconductor substrate, particularly to a process for producing a semiconductor substrate which is applicable to semiconductor devices, integrated circuits, fine mechanical devices, and the like, or which is suitable for dielectric separation, and electronic devices and integrated circuits formed on a monocrystalline semiconductor layer on an insulator.

2. Related Background Art

In recent years, integrated circuits have come to be remarkably more highly integrated. As the results, higher precision is required in of processing of the substrate surface thereof to meet much severer conditions. If the surface becomes rough during the processing, the roughness needs to be eliminated for obtaining a flat smooth surface. Contamination with impurity and particles have also to be avoided.

Polishing is generally employed for flattening the surface of a monocrystal. The polishing is conducted such that the surface to be polished is pressed against polishing cloth made of urethane and is rubbed with it while a polishing liquid composed of a neutral solution or an alkaline solution (e.g., KOH) and a polishing particulate material suspended therein is dropped thereto, to abrade and flatten the surface. For example, a monocrystalline silicon surface is polished and flattened by dropping a suspension, in an alkaline solution (e.g., KOH), of colloidal silica composed of silicon oxide as polishing particulate material.

With the modern technique of polishing of semiconductor substrates, practicably achievable level of surface roughness is several nm in terms of p-v (maximum-minimum difference) and about 0.1 nm in terms of rms (mean square deviation).

Another technique of flattening is heat-treatment.

S. Nakashima and K. Izumi reported that the roughness of the surface having a great number of concavities of several tens of nm was eliminated by heat-treatment at 1260° C. in a nitrogen atmosphere for 2 hours, or at 1300° C. in an argon atmosphere containing 0.5% oxygen for 4 hours, but the roughness did not change by heat-treatment at 1150° C. ( J. Mater. Res. (1990) Vol.5, No.9, p.1918).

T. Sakamoto, et al. reported that, in an Si-MBE apparatus, steps on the surface of Si wafer decreased, and the luminance at the mirror reflection point in reflective high-speed electron diffraction increased monotonously with annealing time when the spontaneously formed oxide film was removed, an Si layer was grown, and the layer was annealed in a high vacuum at a high temperature (700° C. to 1000° C.), as a method for flattening a wafer at an atomic level (Denki Tsushin Gakkai Gijutsu Hokoku (Technical Bulletin of Electro-communication Society) SSD86-25, (1986) p.47).

N. Nakamura, et al. found that rectangular projections and concavities having height and width of about 1 µm on a surface of Si were deformed during heat treatment in ultra high vacuum in an MBE apparatus (Journal of Applied Physics, Vol. 68 (1990), p.3038). They reported that it is important, for causing the deformation, to eliminate the spontaneously formed oxide film from the Si surface to provide a surface that is clean in atomic level.

Aoyama, et al. reported that surface roughness of an Si substrate changed on exposure to hydrogen-diluted fluorine having been excited by UV light, and in particular, a (111) Si surface was flattened by 0.1 to 0.2 nm in terms of rms, and they suggested that this change is caused by rate-controlled oxidation of the (111) surface and removal of the resulting oxide by HF (Ohyo Butsuri Gakkai Gakujutsu Koenkai (Meeting for Scientific Lectures of Applied Physical Society (1991), 12a-B-6).

Of the above-described flattening methods, a polishing method is illustrated in FIGS. 13A and 13B, where the numeral 11 indicates a substrate; 12, irregularity of the substrate surface; 13, a surface state before the polishing; and 14, a surface state after the polishing. As shown in FIG. 13A, the rough surface of monocrystal is removed a certain amount of the surface layer by polishing to obtain a smoothened and flattened surface as shown in FIG. 13B. In other words, polishing for elimination of roughness removes inevitably a certain amount of the surface layer, and variation in the polishing procedure causes disadvantageously variation of the thickness of the polished surface layer. Therefore, in the case where the outermost surface or vicinity thereto of a monocrystal is utilized, the removal of the surface layer by polishing is not suitable for smoothening and flattening of the surface insofar as the thickness of the monocrystal is important. Moreover, the surface layer of monocrystal provided by polishing usually has defects such as distortion and dislocation caused by the polishing operation. After the polishing, such defects need to be eliminated by etching of several hundreds of nm to several µm, or at least several tens of nm, of the surface layer.

The processing of semiconductor devices is practiced in a clean room where contaminating particles are removed ultimately. The polishing process, which is a dust-forming process, has to be separated from other processes, and special care has to be taken in delivery of the intermediate products to or from the separated processes. Therefore the polishing is not practical in the device production.

On the other hand, the flattening by heat-treatment in a nitrogen atmosphere involves problems below, because of the treatment in a high temperature exceeding 1260° C. for a long time:

(1) A specially designed treating-furnace is required which employs a high-temperature-resistant construction material such as SiC in the semiconductor process, since the temperature exceeds the maximum resistance temperature of a silica tube (a silica tube may be distorted at a temperature of 1200° C.).

(2) A number of slip lines may be introduced to the monocrystal owing to temperature distribution in the substrate or temperature variation on putting the substrate into or out from the furnace, since the treating temperature is near the melting point of silicon.

(3) Impurity may diffuse and redistribute, in the case where an impurity such as boron and phosphorus is preliminarily introduced locally in monocrystal layer.

To solve the above problems, a method is being sought which is capable of forming a surface having the same level of flatness as or a higher level than that achieved by polishing, at a temperature for a production process of devices, integrated circuits, etc. or a lower temperature without removal of monocrystal surface.

One of the flattening methods, in which the temperature is adaptable to the process and the surface layer of the monocrystal is not removed, is a heat-treatment in the aforementioned MBE (molecular beam epitaxy) apparatus. This technique, however, relates to a flattening of steps at an atomic layer level (less than 1 nm) or deformation of grooves on a surface by migration of surface atomic layer, but does not relates to elimination of roughness of about 1e3 nm to about 1 nm in terms of p-V. Further, in this technique, a high vacuum or ultra-high vacuum (lower than $1 \times 10^{-11}$ Torr) is required since the removal of an oxide film on the surface and prevention of re-oxidation are indispensable. However, heating in high vacuum involve problems of nonuniform temperature distribution and long time required for cooling because of lack of heat transfer by convention. If heating is conducted with an exothermic body, a further problem of diffusion of an impurity from the exothermic body arises.

Furthermore, the MBE process is expensive in comparison with the polishing treatment because of the necessity of high performance of a pump for the a large volume of an ultra-high vacuum chamber and the cost of the MBE chamber, and additionally involves the above-mentioned problem of the heat source. Therefore, the MBE is not suitable for industrial mass-production processes where a large area of substrate is treated or a large number of substrates are treated simultaneously. Nakamura, et al. (Ohyo Butsuri Gakkai Gakujutsu Koenkai (Meeting for Scientific Lectures of Applied Physical Society (1990), 27a-T-2) pointed out that, in the MBE process, defects are introduced in a high density into monocrystal with deformation over 800° C., which are caused by oxygen and carbon. Thus, at a high temperature where surface atoms can readily move, defects is disadvantageously introduced.

The flattening by hydrogen-diluted fluorine gas which has been excited by UV light leads to improvement by only from about 0.1 to 0.2 nm in terms of rms, and is limited in capability of flattening the roughness, being not capable of improving roughness at the same level as polishing. Furthermore, this method involves plane orientation dependence, and the (100) plane is roughened adversely.

On the other hand, formation of monocrystalline Si semiconductor layer on an insulator is well known as silicon-on-insulator (SOI) technique. Many investigations have been made thereon since the devices made by the SOI technique have many advantages which are not achievable with a bulk Si substrate for usual Si integrated circuits. The advantages brought about by the SOI technique are as below:

1. Ease of dielectric separation, and practicability of high integration,
2. High resistance against radioactive rays,
3. Low floating capacity, and practicability of high speed operation,
4. Practicability of omission of a welling step,
5. Practicability of prevention of latching-up,
6. Practicability of thin film formation for complete depletion type field effect transistor, and so forth.

In order to realize the aforementioned advantages in device characteristics, investigations have been made on the methods of forming the SOI structure for the last few decades. The results of the investigations are collected in the literature, for example: Special Issue: "Single-crystal silicon on non-single-crystal insulators;" edited by G. W. Cullen, Journal of Crystal Growth, Vol. 63, No. 3, pp. 429–590 (1983).

Formerly, the SOS technique (silicon-on-sapphire) is known which heteroepitaxially forms Si on monocrystalline sapphire substrate by CVD (chemical vapor deposition). This technique, although successful as completed SOI technique, is not widely applied because of many crystal defects caused by insufficient coherency of the lattice at the interface between the Si layer and the underlying sapphire substrate, migration of aluminum from the sapphire substrate to the Si layer, and, above all, the high cost of the substrate and difficulty in enlarging the area thereof.

In recent years, the SOI structure without use of the sapphire substrate is going to be realized. This attempt is made in two methods:

(1) method of oxidizing a surface of an monocrystalline Si substrate, forming an aperture in the oxidized layer to uncover locally the Si substrate, and growing Si epitaxially in a lateral direction using the uncovered Si as the seed to form an monocrystalline Si layer on the $SiO_2$ (deposition of Si on $SiO_2$), and (2) method of forming $SiO_2$ under the monocrystalline Si substrate by use of the monocrystalline Si substrate itself as the active layer (no deposition of Si layer).

The means for practicing the method (1) above include direct epitaxial growth of monocrystalline Si layer in a lateral direction by CVD; deposition of amorphous Si and subsequent epitaxial growth in solid in a lateral direction by heat treatment; growth of amorphous or polycrystalline Si into monocrystalline layer by melting-recrystallization by focusing thereon an energy beam such as electron beam and laser light; and zone melting recrystallization. These methods have both advantages and disadvantages, still involving problems in controllability, productivity, uniformity, and quality of the products. Therefore, none of the above methods has been practiced industrially.

For example, the CVD process requires sacrificial oxidation. The solid growth results in low crystallinity. The beam annealing process involves problems in treating time, control of superposition of the beam and focus adjustment. Among the above methods, zone melting recrystallization is most highly developed, and has been employed for experimental production of relatively large integrated circuits. This method, however, still causes crystal defects in subgrain boundary, etc., and does not give a minority carrier device.

The method (2) above, which do not use the Si substrate as the seeds for epitaxial growth, are practiced in the three ways below:

1. A surface of a monocrystalline Si substrate is etched anisotropically to form V-shaped grooves on the surface. An oxide film is formed thereon. On the oxide film, a polycrystalline Si layer is deposited in a thickness that is nearly the same as the Si substrate. Then the Si substrate is abraded at the backside to form dielectrically separated monocrystalline Si regions surrounded by the V-shaped grooves on the thick polycrystalline Si layer. Although this technique gives satisfactory crystallinity, it involves problems in control and productivity in the process of depositing polycrystalline Si in a thickness of as much as several hundred $\mu$m and in the process of abrading the monocrystalline Si substrate from the backside to leave only the separate active Si layer.

2. An $SiO_2$ layer is formed on a monocrystalline Si layer by oxygen ion implantation. This method is called SIMOX (separation by ion implanted oxygen). This process exhibits excellent coherency with the Si process, and is the most highly developed technique at the moment. However, the process requires implantation of oxygen ions as much as $10^{18}$ ions/cm$^2$ to form the $SiO_2$ layer, and the implantation takes long time, so that the productivity is not high, and the wafer cost is high. Furthermore, the product has many remaining crystal defects, and does not have satisfactory quality for industrial production of minority carrier devices.

3. The SOI structure is formed by dielectric separation by oxidation of porous Si. In this method, on a surface of a P-type monocrystalline Si substrate, an N-type Si layer is formed in an island shape by proton ion implantation (Imai, et al.: J. Crystal Growth, vol. 63, 547, (1983)), or by epitaxial growth and patterning, then the P-type Si substrate only is made porous by anodization in an HF solution so as to surround the island-shaped Si regions, and the N-type Si layers are separated dielectrically by accelerated oxidation. This method has disadvantage that the freedom in device design is frequently restricted since the Si region to be separated has to be decided prior to the device production process.

On the other hand, a light-transmissive substrate typified by glass allows Si to grow only into an amorphous or polycrystalline layer under the influence of the disorderness of the crystal structure of the glass, and is unsuitable for production of devices of high performance. Simple deposition of Si on such a substrate will not give excellent monocrystal layer because of the amorphous structure of the substrate. The light-transmissive substrate is important in constructing a light-receiving element for a contact sensor, a projection type liquid crystal image displaying apparatus, and the like. In order to provide a sensor or an image element (picture element) of a display apparatus in higher density, higher resolution, and higher fineness, extremely high performance of the driving device is required. Therefore, the device on a light-transmissive substrate have to be made from monocrystal layer having excellent crystallinity.

In other words, amorphous Si or polycrystalline Si will not generally give a driving device which exhibits the satisfactory performance required or to be required in the future because of many defects in the crystal structure.

On a light-transmissive substrate, however, none of the above methods for a monocrystalline Si substrate is suitable for forming a monocrystal layer with good quality.

SUMMARY OF THE INVENTION

An object of the present invention is to provide a process for producing a semiconductor substrate in which surface roughness is eliminated without decreasing the surface layer thickness to an extent achievable by polishing or a higher extent in a method other than usually employed polishing methods.

Another object of the present invention is to provide a process for producing a semiconductor substrate which has the advantage of the conventional SOI structure and is applicable to various high-performance electronic devices.

Still another object of the present invention is to provide a process for producing a semiconductor substrate which is useful in place of expensive SOS and SIMOX in production of large scale integrated circuits of SOI structure.

A further object of the present invention is to provide a process for producing a semiconductor substrate having, on an insulating layer, an Si layer of crystallinity and surface flatness as high as monocrystalline wafer with prominence in productivity, uniformity, controllability, and cost.

A still further object of the present invention is to provide a process for producing a semiconductor substrate having, on a transparent substrate (light-transmissive substrate), an Si layer of crystallinity as high as monocrystalline wafer with prominence in productivity, uniformity, controllability, and cost.

A still further object of the present invention is to provide a process for producing a semiconductor substrate, comprising heat-treating a substrate having a monocrystal thereon at a temperature lower than the melting point of the monocrystal in a reducing atmosphere, and a process for producing an SOI semiconductor substrate by utilizing the above-mentioned process.

DETAILED DESCRIPTION OF THE PREFERRED EMBODIMENT

Figure 1A:
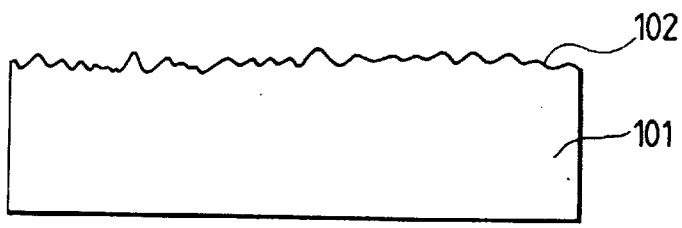
FIGS. 1A to 9C are schematic views illustrating respectively an example of the process for producing the semiconductor substrate of the present invention.

A first embodiment of the process for producing a semiconductor substrate of the present invention is a process comprising heat-treating a substrate having a monocrystal thereon in a reducing atmosphere to flatten and smooth the surface of the monocrystal.

The present invention involves a process for producing a semiconductor substrate having SOI structure by using the first embodiment of the present invention.

A second embodiment of the process for producing a semiconductor substrate of the present invention is a process comprising the steps of porousifying a silicon base member, forming a nonporous monocrystalline silicon layer on the porous material to prepare a first substrate, heat-treating the first substrate at a temperature lower than the melting point of the nonporous monocrystalline silicon in a reducing atmosphere, bonding the surface of the nonporous monocrystalline silicon layer onto a second substrate with interposition of an insulating layer, and then removing the porous silicon by etching.

A third embodiment of the process for producing a semiconductor substrate of the present invention is a process comprising the steps of porousifying a silicon base member, forming a nonporous monocrystalline silicon layer on the porous material to prepare a first substrate, bonding the surface of the nonporous monocrystalline silicon onto a second substrate with interposition of an insulating layer, removing the porous silicon by etching, and heat-treating the bonded substrates at a temperature lower than the melting point of the nonporous monocrystalline silicon in a reducing atmosphere.

A fourth embodiment of the process for producing a semiconductor substrate of the present invention is a process comprising the steps of porousifying a silicon substrate, heat-treating the porousified silicon substrate at a temperature lower than the melting point thereof in a reducing atmosphere to change the surface layer of the porousified silicon substrate into a nonporous monocrystalline silicon layer, bonding the nonporous monocrystalline silicon layer onto the surface comprising an insulating material of a second substrate, and removing the porousified portion of the silicon substrate by etching.

According to the first embodiment of the present invention, a surface of a monocrystal is made as flat as the surface of a monocrystalline wafer with substantially no change of the thickness of the monocrystal without introducing a processing deformation layer and without introducing crystal defects such as slip lines, because the crystal removal procedure like as polishing is not employed. The roughness of several tens of nm in terms of the p-v value can be made flat, which is not achievable by heat-treatment in ultra-high vacuum or by treatment with a UV-excited hydrogen-diluted fluorine gas. This process, which utilizes heat treatment, is capable of treating simultaneously a number of substrates. Further, since the treating temperature is similar to that employed in usual semiconductor process and no ultra-high vacuum is necessary, this process can be realized with an ordinary heat-treating apparatus in a semiconductor process line without additional equipment investment. The heat-treatment can be practiced in continuation to other processes. According to this invention, the roughness in a local monocrystal region on a surface of a substrate which cannot be made flat by polishing can be made flat.

The second to fourth embodiments enable production of a substrate having SOI structure with retention of the advantages of the first embodiment.

According to the second embodiment of the present invention, the surface of the first substrate to be bonded to the second substrate is made as flat as the surface of a wafer by heat treatment in a reducing atmosphere, whereby the nonuniformity of the bonding is avoided and the strong and uniform bonding is realized throughout the whole substrate.

According to the third embodiment of the present invention, the surface after removal of porous silicon layer by etching can be made as flat as the surface of a wafer by heat treatment in a reducing atmosphere.

According to the fourth embodiment of the present invention, a silicon substrate-is made porous and then is heat-treated at a temperature lower than the melting point thereof to transform the surface of the porous silicon substrate into a nonporous monocrystalline silicon layer, whereby a monocrystalline silicon layer can be formed with high crystallinity on a porous silicon substrate, without using a source gas such as silane.

The present invention is described below in more detail by reference to specific embodiments and examples.

Embodiment 1

Figure 1B:
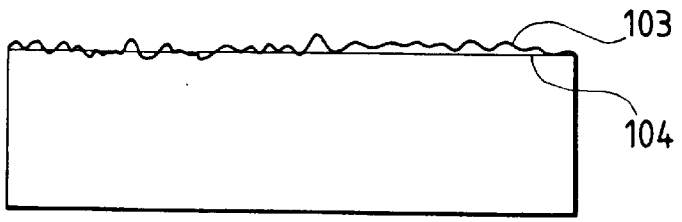

The inventors of the present invention investigated heat treatment for elimination of fine roughness of a surface of monocrystalline silicon, and have found that the roughness of the surface of monocrystalline silicon can be eliminated by heat treatment in a reducing atmosphere at a temperature not higher than that in a device process without application of ultra-high vacuum. The "reducing atmosphere" herein includes a hydrogen-containing atmosphere, and a hydrogen atmosphere, but is not limited thereto. As the results of detailed observation of changes of the surface roughness by high-resolution scanning electron microscopy and interatomic force microscopy, it was found that the surface roughness before the heat treatment as shown in FIG. 1A is decreased by heat treatment in a reducing atmosphere, and a thin monocrystal layer having a flat surface is obtained as shown in FIG. 1B. In FIGS. 1A and 1B, the numeral 101 denotes a substrate; 102, roughness on the surface of the substrate; 103, a surface state before the heat treatment; and 104, a surface state after the heat treatment. In the case where the surface roughness is eliminated by polishing, the thickness of the monocrystal layer may vary in the plane. On the contrary, in the heat treatment in a reducing atmosphere of the present invention, the fine roughness only is removed, but the thickness of the monocrystal itself does not vary. Accordingly, the surface flattening by the heat treatment does not cause additional thickness variation.

It was found that the surface roughness of monocrystalline silicon having a roughness of about several nm to several tens of nm in terms of the p-v value in a cycle of several nm to several hundreds of nm (FIG. 1A) can be flattened by heat treatment in a reducing atmosphere to a p-v value of several nm or less, or 2 nm or less under optimum conditions (FIG. 1B) as shown by the numeral 104 in FIG. 1B, which is the same flatness level as monocrystalline silicon wafer. This phenomenon is considered to be reconstruction of the surface rather than etching. On a rough surface, a number of edge-shaped portions exist which have high surface energy, and faces of higher order of orientation than the plane orientation of the crystal layer are exposed in great numbers on the surface. The surface energy in such regions is higher than the surface energy depending on the plane orientation of the surface of monocrystal. In the heat treatment in a reducing atmosphere, a spontaneously formed oxide film on the surface is removed by reducing action of the reducing substance such as hydrogen and does not deposit again during the heat treatment. It is considered that the energy barrier to the movement of surface Si atoms is lowered thereby, which causes movement of Si atoms excited by the thermal energy to construct flat surface having lower surface energy. Therefore, the flattening of the present invention is promoted at the lower index of the plane orientation of the monocrystal surface.

Consequently, the surface is flattened sufficiently at a temperature of 1200° C. or lower where the surface cannot be flattened in a nitrogen atmosphere or a rare gas atmosphere. The temperature of the heat treatment for flattening the surface in the present invention depends on the gas composition, the pressure, etc., and is usually in the range of from 300° C. to the melting point of the flattened substance, preferably not lower than 500° C. and not higher than 1200° C. With a higher reducing ability of the atmosphere, the flattening can be promoted at a higher pressure. The pressure is usually not higher than the normal atmospheric pressure, more preferably not higher than 200 Torr. When the flattening proceeds at a low rate undesirably, the heat treatment time is prolonged to obtain a desired flatness of the surface.

This phenomenon is initiated by heat treatment on a clean surface. If the surface is covered with a thick spontaneous oxide film, the initiation of surface flattening is hastened by preliminary removal of the oxide film, e.g., by etching with dilute hydrofluoric acid prior to the heat treatment.

The resulting flat surface of monocrystal is suitable for use for production of semiconductor elements.

Embodiment 2

A method is explained in which an Si substrate is made porous and thereon a monocrystal layer is grown epitaxially.

Figure 2A:
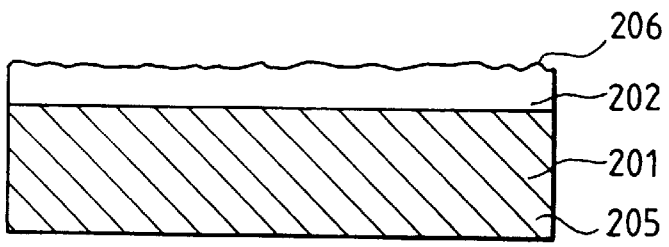
Figure 4A:
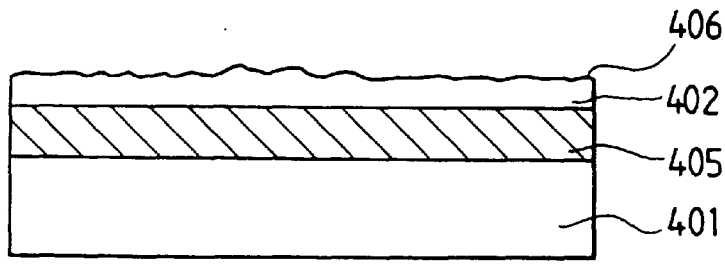

A monocrystalline Si substrate 201 is made porous entirely as shown in FIG. 2A or partially as shown in FIG. 4A by anodization in an HF solution. While the density of monocrystalline Si is 2.33 g/cm$^3$, the density of porous monocrystalline Si layer can be varied in the range of from 0.6 to 1.1 g/cm$^3$ by varying the concentration of the HF solution in the range of from 50 to 20%. The porous monocrystalline Si layer tends to be formed readily in a P-type substrate by the reasons below. The pores formed have an average diameter of from about 50 Å to about 600 Å according to observation by transmission electron microscopy.

The porous monocrystalline Si was found in the course of study on electropolishing of semiconductors in the year 1956 by A. Uhlir et al. (A. Uhlir et al.: Bell Syst. Tech. J., vol. 35, p. 333 (1956)). The dissolving reaction of Si in anodization was studied by Unagami, who reported that positive holes are required for anodic reaction of Si in an HF solution and the reaction proceeds according to the formulas below (T. Unagami: J. Electrochem. Soc., vol. 127, p. 476 (1980):

$Si+2HF+(2-n)e^+ \rightarrow SiF_2+2H^++ne^-$ $SiF_2+2HF \rightarrow SiF_4+H_2$ $SiF_4+2HF \rightarrow H_2SiF_6$ or otherwise, $Si+4HF+(4-\lambda)e^+ \rightarrow SiF_4+4H^++\lambda e^-$ $SiF_4+2HF \rightarrow H_2SiF_6$ where $e^+$ and $e^-$ represent respectively a positive hole and an electron; n and $\lambda$ represent respectively the number of the positive holes required for dissolving one atom of monocrystalline Si, and it was also reported that porous monocrystalline Si is formed if n>2, or $\lambda$>4.

Accordingly, a P-type Si having positive holes is considered to be more readily made porous. This selectivity in porous structure formation has already been actually proved by Nagano et al. (Nagano, Nakajima, Yasuno, Ohnaka, and Kajihara: Densi Tsushin Gakkai Gijutsu Kenkyu Hokoku (Technical Bulletin of Electronic Communication Society) vol. 79, SSD 79–9549 (1979)) and K. Imai: Solid State Electronics, vol. 24, p. 159 (1981)). Thus, P-type silicon having positive holes can be selectively made porous.

On the other hand, it was also reported that high-concentration N-type monocrystalline Si can also be made porous (R. P. Holmstorm, I. J. Y. Chi: Appl. Phys. Lett. vol. 42, p. 386 (1983)). Therefore it is important to select the substrate capable of being made porous, regardless of whether the structure is of P-type or of N-type.

Subsequently, a thin monocrystal layer 202 is formed on the porous substrate surface by epitaxial growth according to various growth method.

In the porous Si layer, pores of about 600 Å in average diameter are formed according to observation with transmission electron microscopy. Although the density thereof is half or less than the density of monocrystalline Si, the monocrystallinity is retained, and epitaxial growth of monocrystalline Si is practicable on the surface. However, rearrangement of the internal pores occurs at a temperature above 1000° C., which impairs the characteristics of enhanced etching. Therefore, the epitaxial growth of monocrystalline Si is preferably conducted by a low temperature growth process such as molecular beam epitaxial growth, plasma CVD, thermal CVD, photo-assisted CVD, bias sputtering, liquid crystal growth, etc.

In the epitaxial growth on the porous Si, the strain which arises in the heteroepitaxial growth can be relaxed, and development of defects can be prevented by the structural feature of the porous Si.

The thin monocrystalline layer which is grown epitaxially on the porous Si, may have a rough surface that is not suitable for the bonding to the second substrate mentioned later, or may locally be peeled off in the later heat treatment or etching process even if it has been once bonded to each other, depending on the shape of the porous Si, as shown in FIG. 2A and FIG. 4A.

Figure 2B:
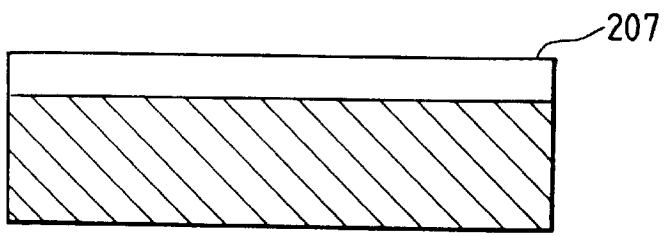
Figure 4B:
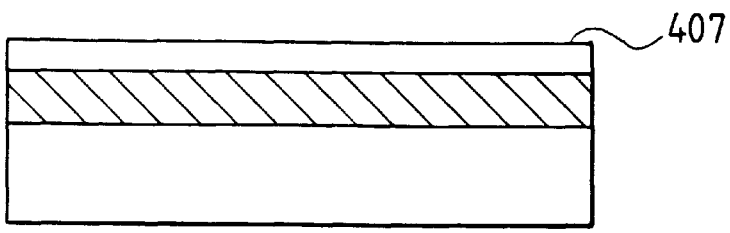

In the present invention, after the thin monocrystal layer is formed on the porous layer, the substrate having the thin monocrystal layer formed thereon is heat-treated in a reducing atmosphere to flatten the surface of the thin monocrystalline Si layer as shown in FIG. 2B and FIG. 4B. The conditions of the heat treatment are the same as in Embodiment 1.

In FIG. 2A and FIG. 2B, the numeral 205 denotes porous silicon; 202, epitaxially grown silicon; 206 the surface state of the epitaxially grown silicon; and 207, the surface state after heat treatment of the epitaxially grown silicon.

Figure 2C:
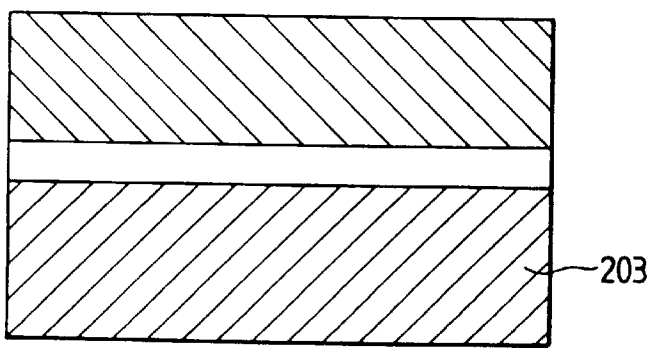
Figure 4C:
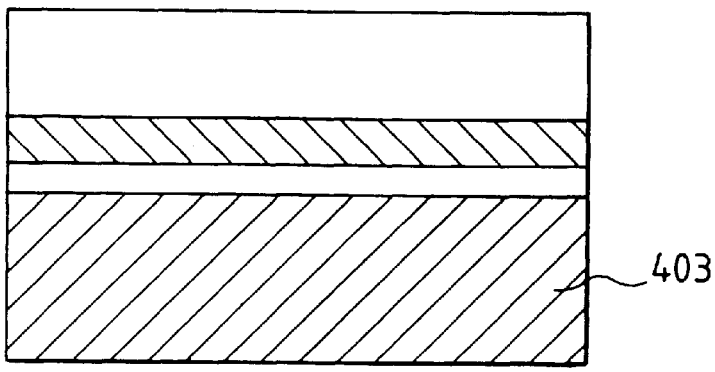
Figure 4D:
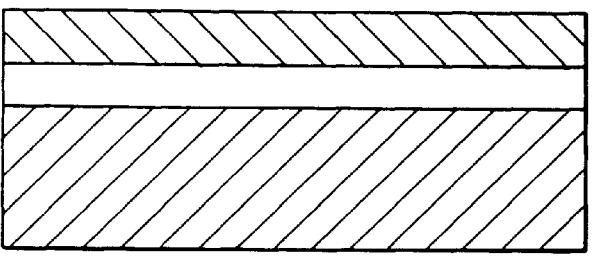

The surface of the monocrystalline Si layer on the porous Si substrate is bonded to another substrate 203 such as a silicon substrate having an insulating layer on the surface thereof, a light-transmissive substrate typified by glass, and the like as shown in FIG. 2C and FIG. 4C. Prior to the bonding, the oxide layer may be formed on the surface of the monocrystalline layer on the porous Si as the interface between the monocrystalline silicon layer and the insulating layer. This oxide layer will play an important role in production of a device. That is, the level of underlying interface formed by oxidation of the monocrystalline silicon layer of the active Si layer can be made lower than the level of the bonding interface, in particular, of the interface with glass. Thus by locating the bonding interface apart from the active layer, the level which may be generated at the bonding interface can be kept apart, thereby the performance of the resulting electron device is remarkably improved. An oxide layer formed on the surface of the monocrystalline Si layer on the porous Si may be bonded to a desired substrate such as an Si substrate.

Figure 2D:
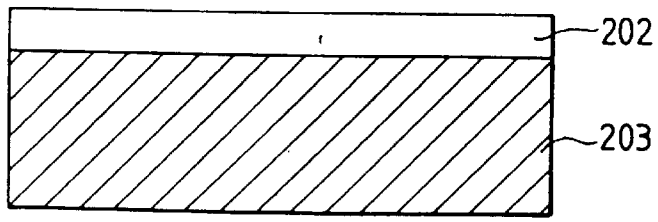

Subsequently, the porous Si substrate 15 is entirely removed by chemical etching. The thin monocrystalline Si layer remains on an insulating layer on the substrate or a light transmissive substrate as shown in FIG. 2D. Prior to the etching, an etching preventing film may be formed, if necessary. For example, the bonded two substrates are entirely coated by deposition of $Si_3N_4$, and then the $Si_3N_4$ layer on the surface of the porous Si substrate is removed. Apiezon Wax as another etching preventing film may be used in place of the $Si_3N_4$ layer.

The porous layer has a density of half or less than the density of nonporous layer because of the great number of voids formed in the interior thereof, and has a greater surface area for the volume. Consequently, the rate of the chemical etching is significantly greater than that of a normal nonporous monocrystalline layer.

The known methods for the etching of porous Si include:

(1) Etching of porous Si with an aqueous NaOH solution (G. Bonchil, R. Herino, K. Barla, and J. C. Pfister: J. Electrochem. Soc., vol. 130, no. 7, p. 1611 (1983)), and (2) Etching of porous Si with an etching solution capable of etching monocrystalline Si.

In the above method (2), a hydrofluoric nitric acid type etching solution is used normally. With this etching solution, the etching proceeds through oxidation of Si by nitric acid to form $SiO_2$ and subsequent etching of the resulting $SiO_2$ with hydrofluoric acid as shown below:

$Si+2O \rightarrow SiO_2$ $SiO_2+4HF \rightarrow SiF_4+2H_2O$

The known methods for etching crystalline Si include etching with an ethylenediamine type, KOH type, or hydrazine type of etching solution as well as the above hydrofluoric nitric acid type etching solution.

The selective etching of porous Si, which is particularly effective and important in the present invention, employs hydrofluoric acid or a buffered hydrofluoric acid which does not have etching action for crystalline Si. In this etching, an aqueous hydrogen peroxide solution may be used additionally as an oxidizing agent. The reaction rate can be controlled by changing the ratio of addition of the hydrogen peroxide. An alcohol may be added which serves as a surface active agent to remove instantaneously the bubbles of the gaseous reaction product from the etching surface, and enables selective etching of porous Si uniformly and efficiently.

Figure 4E:
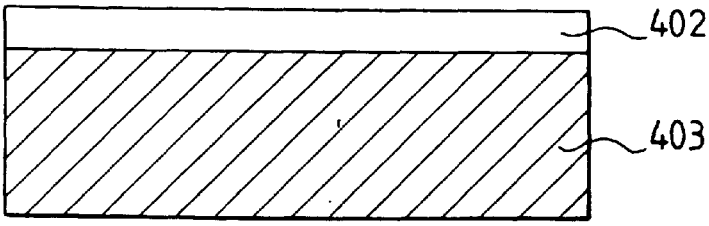

In the case where the Si substrate 401 is changed partially to porous Si 405 as shown in FIGS. 4A to 4C, the nonporous part of the Si is removed at the backside of the substrate opposite to the porous layer to uncover the porous layer 405 by grinding or polishing, or etching with a mixture of hydrofluoric acid, nitric acid and acetic acid, or combination thereof as usually employed in Si wafer production (FIG. 4D), and then the porous Si layer is removed by chemical etching to leave the thin monocrystalline Si layer on the surface of the insulating layer on a substrate or on the surface of a light-transmissive substrate as shown in FIG. 4E. In FIGS. 4A to 4E, the numeral 402 denotes epitaxially grown Si; 406, a surface state of epitaxially grown Si; and 407, a surface state after the heat treatment of the epitaxially grown Si.

FIG. 2D and FIG. 4E illustrate respectively a semiconductor substrate according to the present invention, in which a monocrystalline layer 202, 402 having crystallinity similar to a silicon wafer is formed in a shape of uniform flat thin layer in a large area on the substrate having an insulating layer on the surface 203, 403 or a light-transmissive substrate 203, 403 over the entire wafer.

The resulting semiconductor substrate is useful for production of dielectrically isolated electronic elements.

Embodiment 3

Figure 3A:
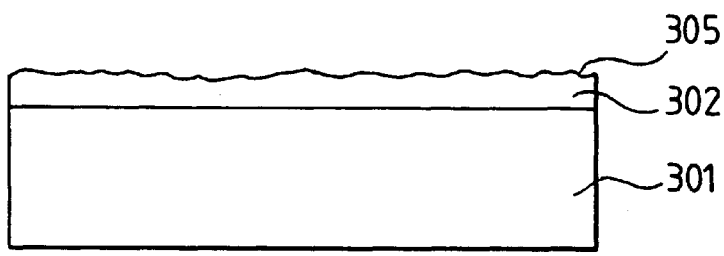

Firstly, as shown in FIG. 3A, a low-impurity-concentration layer 302 is formed epitaxially by a thin film growth method, or otherwise an N-type monocrystalline layer 302 is formed by proton ion implantation, on the surface of a P-type monocrystalline Si substrate 301.

Figure 3B:
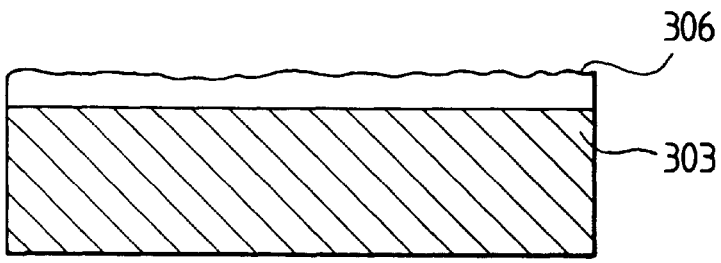

Then as shown in FIG. 3B, the P-type monocrystalline Si substrate 301 is made porous from the backside by anodization by use of an HF solution to form a porous Si layer 303. While the density of monocrystalline Si is 2.33 g/cm$^3$, the density of porous monocrystalline Si layer 15 can be varied in the range of from 1.1 to 0.6 g/cm$^3$ by varying the concentration of the HF solution in the range of from 50 to 20%. The porous layer is formed in a P-type substrate as described before.

Figure 3C:
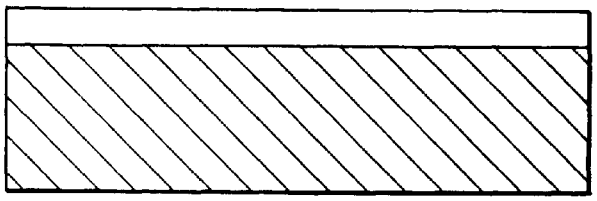
Figure 3D:
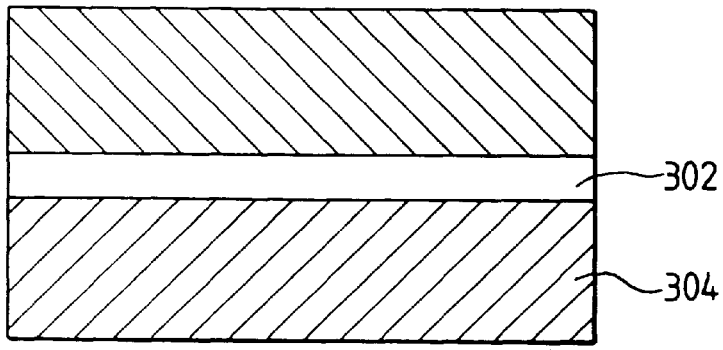

Thereafter, the surface roughness is lessened by heat treatment of the nonporous Si monocrystalline Si layer in a reducing atmosphere in the same manner as in the above Embodiment 2 (FIG. 3C), and the surface of the monocrystalline Si layer on the porous Si substrate or an oxidized surface of the monocrystalline Si layer is bonded to another substrate 304 having insulating layer on the surface thereof as shown in FIG. 3D. Otherwise, an oxidized surface formed on the monocrystalline Si layer surface is bonded to any desired substrate such as an Si substrate.

Figure 3E:
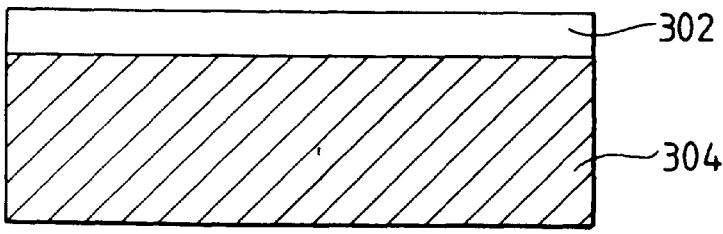

The porous layer of the porous Si substrate 303 is removed entirely by etching to obtain a substrate having an insulting layer thereon and thin monocrystalline silicon layer further thereon as shown in FIG. 3E.

FIG. 3E illustrates a semiconductor substrate, in which a monocrystalline layer 302 having crystallinity similar to a silicon wafer is formed in a shape of uniform flat thin layer in a large area on a substrate 304 having an insulating layer on the surface or a light-transmissive substrate 304 over the entire wafer.

The resulting semiconductor substrate is useful for production of dielectrically isolated electronic elements.

In the above embodiments, an N-type layer is formed before the porous structure formation, and subsequently the P-type portion of the substrate only is selectively made porous.

Embodiment 4-1

Figure 5A:
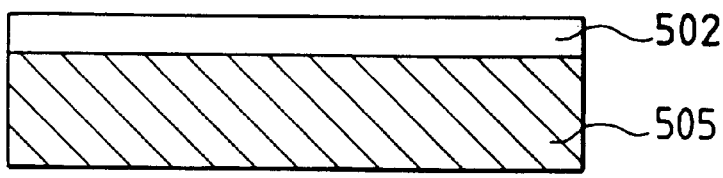
Figure 7A:
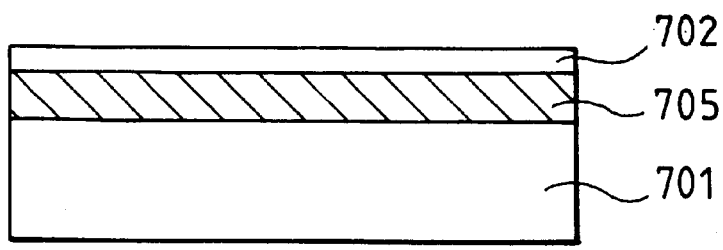

A monocrystalline Si substrate 701 is made porous entirely as shown in FIG. 5A or partially as shown in FIG. 7A by anodization in an HF solution in the same manner as in above Embodiments to form a porous layer 505, 705.

Subsequently, a thin monocrystal layer 502, 702 is formed on the porous substrate surface by epitaxial growth according to any growth method.

Known methods for the etching of porous Si, and the effective method for selective etching of the porous Si in the present invention are described before.

Figure 5B:
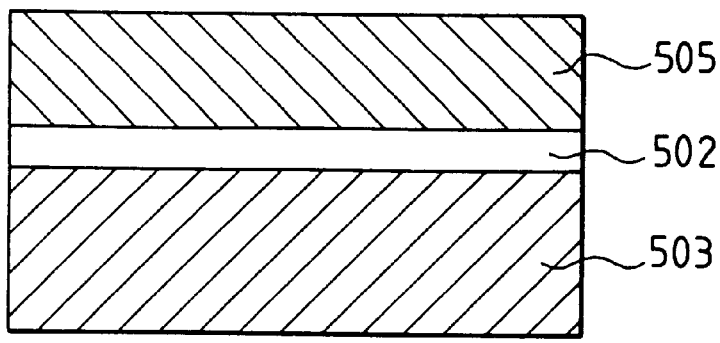
Figure 7B:
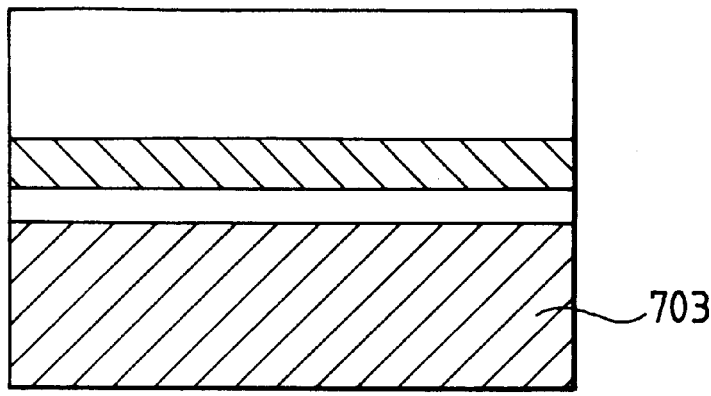

Subsequently, as shown in FIG. 5B and FIG. 7B, the surface of the monocrystalline Si layer is bonded to the surface of another substrate 503, 703, for example, a silicon substrate as a base material having an insulating layer on the surface, or a light-transmissive insulating substrate typified by glass.

Prior to the bonding, an oxide layer may be formed on the surface of the monocrystalline layer on the porous Si as the interface between the monocrystalline silicon layer and the insulating layer. This oxide layer will play an important role in production of a device. That is, the level of the underlying interface formed by oxidation of the monocrystalline silicon layer of the active Si layer can be made lower than the level of the bonding interface, in particular, of the interface with glass. Thus by locating the bonding interface apart from the active layer, the energy level which may be generated at the bonding interface can be kept apart, thereby the performance of the resulting electron device is remarkably improved. The oxide layer formed on the surface of the monocrystalline Si layer on the porous Si may be bonded to a desired substrate such as an Si substrate.

Figure 5C:
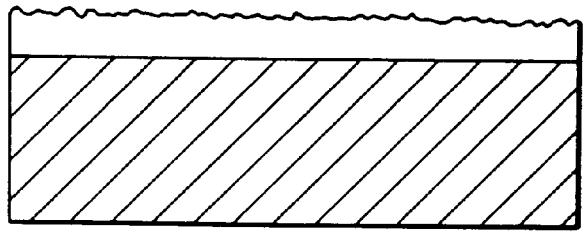

Subsequently, the porous Si substrate 505 is removed by chemical etching. The thin monocrystalline Si layer remains on an insulating layer on the substrate or a light transmissive substrate as shown in FIG. 5C. Prior to the etching, an etching preventing film may be formed, if necessary. For example, the bonded two substrates are entirely coated by deposition of $Si_3N_4$, and then the $Si_3N_4$ layer on the surface of the porous Si substrate is removed. Apiezon Wax may be used in place of the $Si_3N_4$.

Figure 7C:
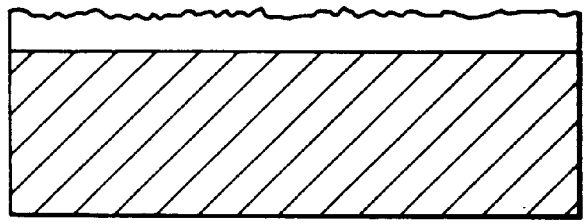

In the case where the Si substrate is partially made porous as in the steps shown in FIGS. 7A and 7B, the nonporous part of the Si is removed at the backside of the substrate opposite to the porous layer to uncover the porous layer by grinding or polishing, or etching with a mixture of hydrofluoric acid, nitric acid and acetic acid, or combination thereof as usually employed in Si wafer production, and then the porous Si layer is removed by chemical etching to leave the thin monocrystalline Si layer on the surface of the insulating layer on a substrate or a light-transmissive substrate as shown in FIG. 7C.

The resulting substrate which has a nonporous monocrystalline silicon layer on an insulating layer after the removal of the porous silicon layer is heat-treated in a reducing atmosphere to form a monocrystalline silicon layer having a flat surface on a substrate having an insulation layer on the surface or on a light-transmissive substrate as shown in FIG. 5C and FIG. 7C.

The inventors of the present invention investigated the heat treatment for eliminating the minute roughness of the surface of thin nonporous monocrystalline silicon, and found that the roughness of the nonporous monocrystalline silicon surface can be eliminated by heat treatment in a reducing atmosphere at a temperature usually employed in device processes or lower. The reducing atmosphere herein includes a hydrogen-containing atmosphere and a hydrogen atmosphere, but is not limited thereto. As the result of the detailed observation of the state of the surface roughness in heat treatment in various atmospheres by high resolution scanning electron microscope, interatomic force microscope, etc., it was found that the irregularity of the surface before the heat treatment is lessened by heat treatment in a reducing atmosphere, and the surface of the thin monocrystal layer becomes flat as shown in FIG. 5C and FIG. 7C. If the surface roughness is eliminated by polishing or a like method, the thickness of the monocrystal layer tends to vary throughout the layer. On the contrary, in the present invention, the minute irregularity of the surface can be eliminated without causing variation of layer thickness by the heat treatment in a reducing atmosphere.

In the microscopic structure of the surface of a nonporous monocrystalline silicon, periodical irregularity of several nm to several tens of nm in height difference in a cycle of from several nm to several hundreds of nm is observed. The heat treatment in a reducing atmosphere gives a flat surface of height difference of not more than several nm, or not more than 2 nm under optimum conditions. This phenomenon is considered to be reconstruction of the surface rather than etching. On a rough surface, a number of edge-shaped portions exist which have high surface energy, and faces of higher order of orientation than the plane orientation of the crystal layer are exposed in great numbers on the surface. The surface energy in such regions is higher than the surface energy at the plane orientation of the surface of the first substrate. In the heat treatment in a reducing atmosphere, a spontaneously formed oxide film on the surface is removed by reducing action of the reducing substance such as hydrogen and does not deposit again during the heat treatment. It is considered that the energy barrier to the movement of surface Si atoms is lowered thereby, which causes movement of Si atoms excited by the thermal energy to construct flat surface having lower surface energy.

Consequently, the surface is flattened sufficiently at a temperature of 1200° C. or lower where the surface cannot be flattened in a nitrogen atmosphere or a rare gas atmosphere. The temperature of the heat treatment for flattening the surface in the present invention depends on the gas composition, the pressure, etc., and is usually in the range of from 300° C. to the melting point of the flattened substance, preferably not lower than 500° C. and not higher than 1200° C. With a higher reducing ability of the atmosphere, the flattening can be promoted at a higher pressure. The pressure is usually not higher than the normal atmospheric pressure, more preferably not higher than 200 Torr.

This phenomenon is initiated by heat treatment on a clean surface. If the surface is covered with a thick spontaneous oxide film, the initiation of surface flattening is hastened by preliminary removal of the oxide film, e.g., by etching with dilute hydrofluoric acid prior to the heat treatment.

Figure 5D:
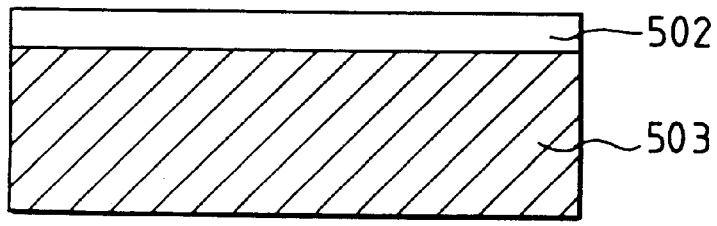
Figure 7D:
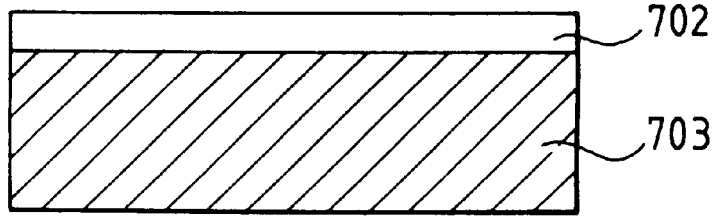

FIG. 5D and FIG. 7D illustrate respectively a semiconductor substrate, in which a monocrystalline Si layer 502, 702 having crystallinity similar to a silicon wafer is formed in a shape of uniform flat thin layer in a large area on the substrate having an insulating layer on the surface 503, 703 or a light-transmissive substrate 503, 703 over the entire wafer.

The resulting semiconductor substrate is useful for production of dielectrically isolated electronic elements.

Embodiment 4-2

Figure 6A:
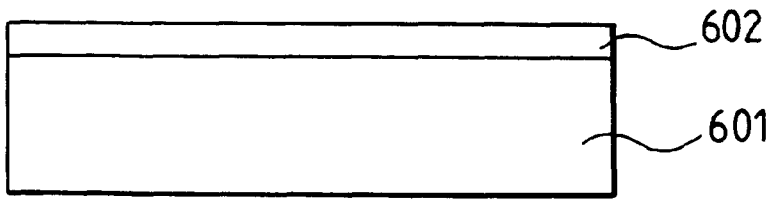

Firstly, as shown in FIG. 6A, a low-impurity-density layer 602 is formed epitaxially by a thin film growth method, or otherwise an N-type monocrystalline layer 602 is formed by proton ion implantation, on the surface of a P-type monocrystalline Si substrate 601.

Figure 6B:
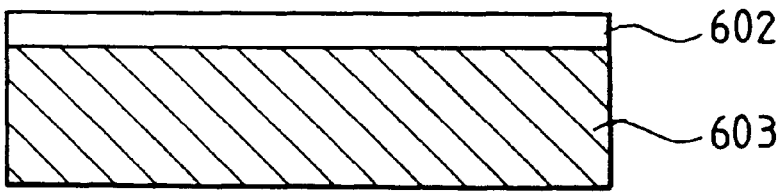

Then as shown in FIG. 6B, the P-type monocrystalline Si substrate 601 is made porous from the backside by anodization by use of an HF solution to form a porous Si layer 603. While the density of monocrystalline Si is 2.33 g/cm$^3$, the density of porous monocrystalline Si layer 15 can be varied in the range of from 1.1 to 0.6 g/cm$^3$ by varying the concentration of the HF solution in the range of from 50 to 20%. The porous layer is formed in a P-type substrate as described before.

Figure 6C:
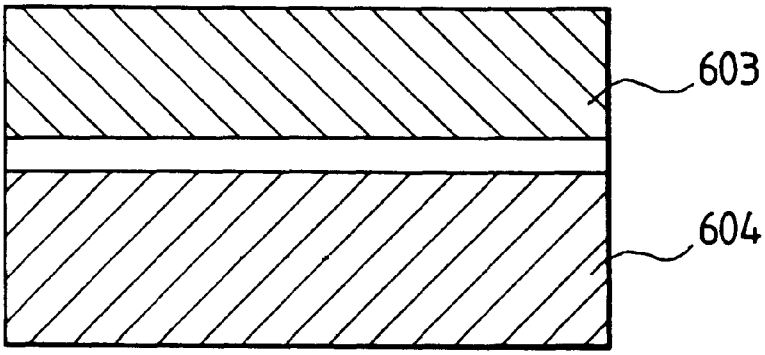

The surface of the monocrystalline Si layer on the porous Si substrate or an oxidized surface of the monocrystalline Si layer is bonded to another substrate 604 having an insulating layers the surface thereof, or otherwise, the oxidized surface of the monocrystalline Si layer is bonded to any desired substrate such as an Si substrates shown in FIG. 6C.

Figure 6D:
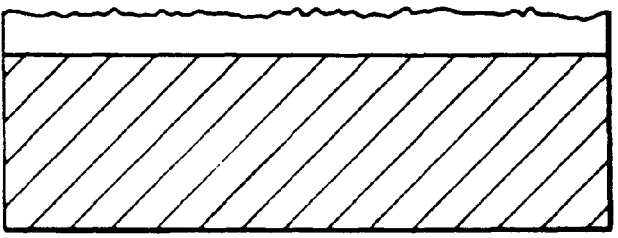

The porous layer of the porousified Si substrate 603 is removed entirely by etching to obtain a substrate having an insulting layer thereon and thin monocrystalline silicon layer further thereon as shown in FIG. 6D.

Figure 6E:
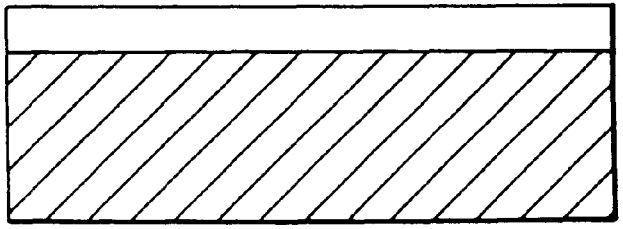

Then in the same manner as in Embodiment 4-1, the substrate having the nonporous monocrystalline silicon layer on the insulating layer after the removal of the porous silicon is heat-treated in a reducing atmosphere to improve the surface roughness, thereby obtaining a semiconductor substrate of the present invention as shown in FIG. 6E. Consequently, a monocrystalline Si layer 602 having crystallinity similar to a silicon wafer is formed in a shape of uniform flat thin layer in a large area on a substrate 604 having an insulating layer on the surface or a light-transmissive substrate 604 over the entire wafer.

The resulting semiconductor substrate is useful for production of dielectrically isolated electronic elements.

In the above embodiments, an N-type layer is formed before the porous structure formation, and subsequently the P-type portion of the substrate only is selectively made porous by anodization.

Embodiment 5

Figure 8A:
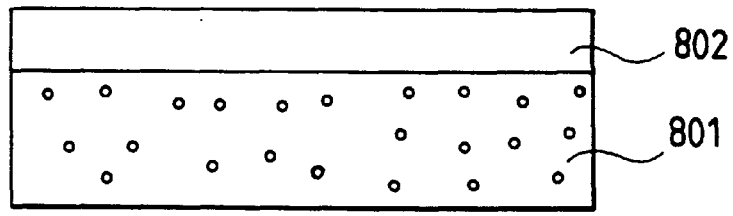

A monocrystalline Si substrate is made porous as shown in FIG. 8A by anodization in an HF solution. In the porous structure formation, the entire, the front surface, or the both surfaces of the substrate may be made porous. Then, the substrate is heat-treated in a non-oxidizing atmosphere or in vacuo at a temperature lower than the melting point of the Si substrate to transform the surface layer of the porous monocrystalline Si substrate 801 into a thin nonporous monocrystal layer 802.

Figure 10:
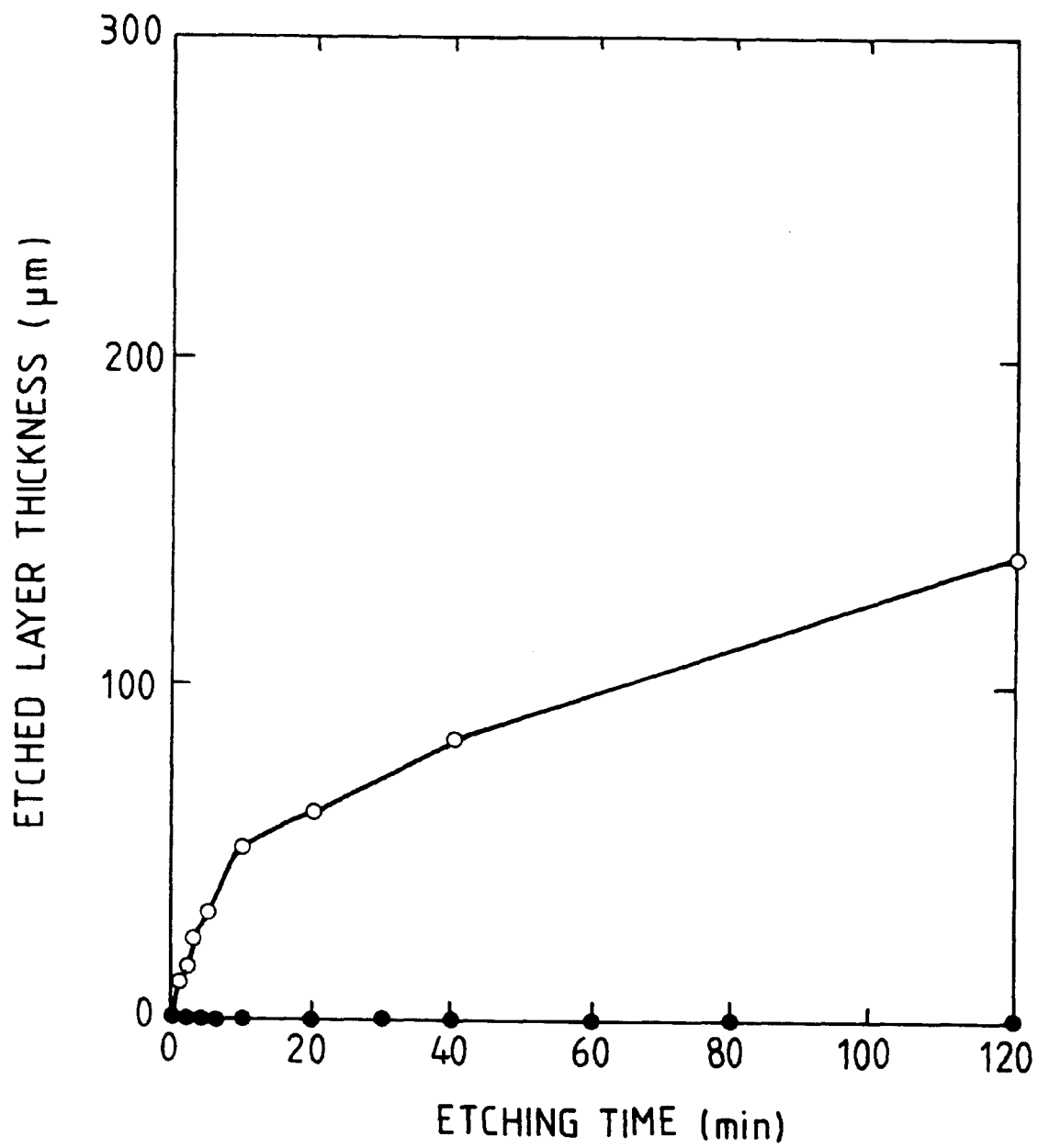
FIGS. 10 and 11 are respectively a graph showing the properties of porous silicon in etching.

FIG. 10 shows the dependency of the layer thickness by etching of the porous Si and that of the monocrystalline Si on etching time in the case where the porous Si and the monocrystalline Si are respectively etched by immersion in a mixture of a buffered hydrofluoric acid, alcohol, and an aqueous hydrogen peroxide solution without stirring.

The porous structure formation and the etching step are explained specifically.

The porous Si is prepared by anodization. The anodization conditions are shown below. The starting material of the porous Si prepared by anodization is not limited to monocrystalline Si, but may be Si of any other crystal structure.

Applied voltage: 2.6 V
Current density: 30 mA·cm$^{-2}$
Anodization solution: HF:H$_2$O:C$_2$H$_5$OH=1:1:1
Time: 2.4 hours
Porous Si thickness: 300 μm
Porosity: 56%

The porous Si prepared under the above conditions was immersed in a 10:6:50 mixture of buffered hydrofluoric acid (4.5% HF+36% NH$_4$F+H$_2$O), alcohol, and aqueous 30% hydrogen peroxide solution at room temperature without stirring. The decrease of the thickness of the porous Si was measured later. The progress of the etching is shown by blank circles (○) in FIG. 10. The porous Si was etched rapidly in the etched layer thickness of 83 μm in 40 minutes and 140 μm in 120 minutes uniformly with retention of satisfactory surface property. The etching rate depends on the concentration of the solution and the temperature.

As described before, the addition of alcohol allows the instantaneous removal of bubbles formed by the etching reaction from the etched surface without stirring, thus enabling uniform and effective etching of the porous Si. The addition of the aqueous hydrogen peroxide solution accelerates the oxidation of silicon, and thereby increases the reaction velocity in comparison with the case where hydrogen peroxide is absent. Further the reaction velocity can be controlled by changing the ratio of the hydrogen peroxide solution.

Separately, nonporous Si of 500 μm thick was immersed in the 10:6:50 mixture of buffered hydrofluoric acid (4.5% HF+36% NH$_4$F+H$_2$O), alcohol, and aqueous 30% hydrogen peroxide solution at room temperature without stirring. The decrease of the thickness was measured later. The progress of the etching is shown by solid circles (●) in FIG. 10. The nonporous Si was etched by not more than 100 Å even after 120 minutes of etching.

After the etching, the porous Si and the nonporous Si were washed with water. The surfaces contained no impurity according to microanalysis by secondary ion mass spectrometry.

The alcohol in the invention includes ethyl alcohol, and other alcohols such as isopropyl alcohol which causes no inconvenience and exhibits the effect of addition of the alcohol.

Figure 12:
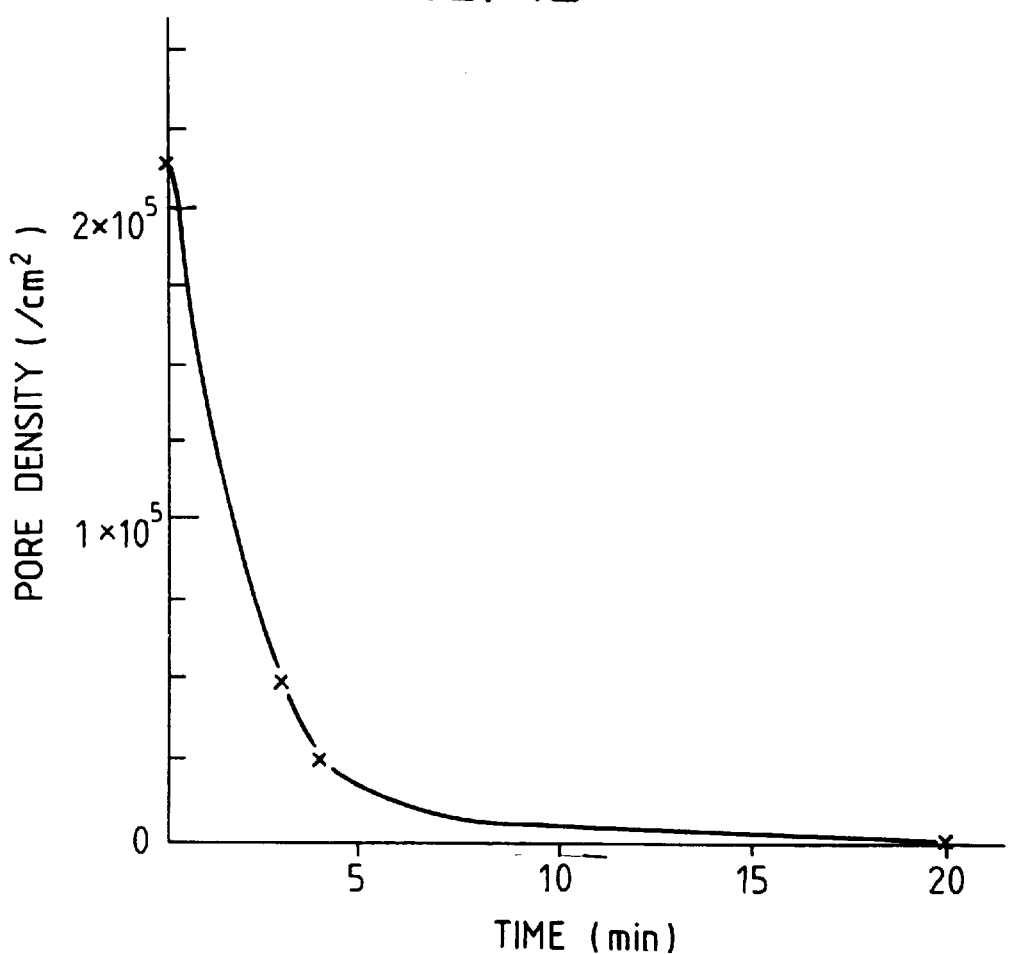
FIG. 12 is a graph showing the change of pore density by heat-treatment.
Figure 13A:
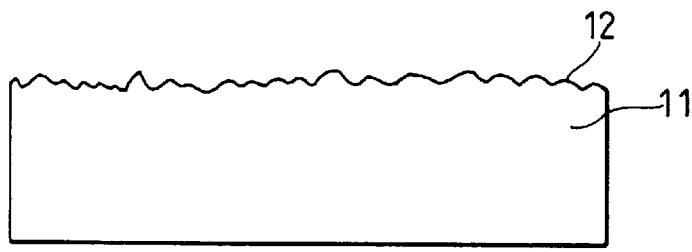
FIGS. 13A and 13B illustrate schematically flattening of the surface of a semiconductor substrate by conventional polishing process.
Figure 13B:
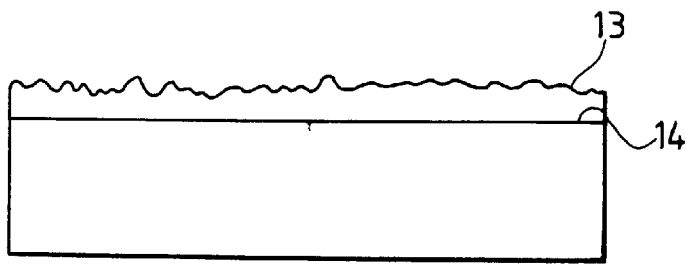

The inventors of the present invention observed the change of the structure of the porous layer during the heat treatment by changing the atmosphere and the like by use of high-resolution scanning electron microscopy and other means. As the results, it was found that the number of pores on the surface of the porous layer decreases by heat treatment in a reducing atmosphere or in vacuo, progress depending on the conditions. For example, as shown in FIG. 12, the pores decreased in number with lapse of time, and finally disappeared, whereby a thin monocrystal layer having a smooth surface was formed. In the heat treatment of the surface and the portion near the surface of the porous Si substrate formed by anodization, the pores disappears so as to lower the surface energy to flatten the surface, thereby the thin nonporous monocrystal layer being formed.

The nonporous monocrystal layer having a flat surface was confirmed to have the same orientation as the substrate by RHEED and electron beam channeling pattern.

This phenomenon is promoted at a higher temperature and at a lower pressure. The reducing atmosphere herein includes hydrogen-containing atmosphere and a hydrogen atmosphere, but is not limited thereto. The temperature for the heat treatment depends on the gas composition, the pressure, etc., and is usually in the range of from 300° C., preferably 500° C. to the melting temperature. With a higher reducing ability of the atmosphere, the flattening can be promoted at a higher pressure, and usually the flattening is conducted at the normal atmospheric pressure or lower, more preferably not higher than 200 Torr. There is no lower limit of the pressure. Ultra-high vacuum is not especially necessary. The term "in vacuo" in the present invention means the pressure of 1×10$^{-3}$ Torr or lower, preferably 1×10$^{-5}$ Torr or lower without introducing an atmospheric gas in a state of no leak of the reaction chamber.

This phenomenon is initiated on a clean surface by heat treatment. If the surface is covered with a thick spontaneously formed oxide film, the initiation of the surface flattening is hastened by preliminary elimination of the oxide film, e.g., by etching with hydrofluoric acid prior to the heat treatment.

Figure 8B:
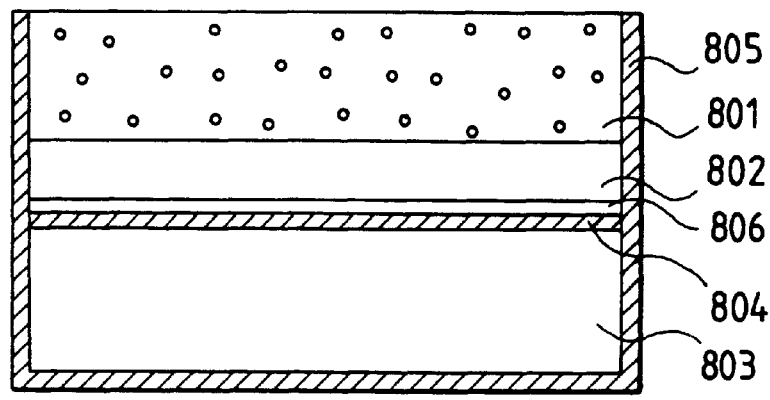

On the surface of another Si substrate 803, an oxide layer 804 is formed as shown in FIG. 8B. Then the Si substrate 803 having the oxide layer 804 is bonded to the surface of the monocrystalline Si layer 802 on the porous Si substrate 801. The bonding is conducted by bringing the cleaned surfaces into contact with each other and then heating in an oxygen atmosphere or a nitrogen atmosphere.

Prior to the bonding, an oxide layer 806 may be formed on the nonporous monocrystalline silicon layer 802, which is then bonded to the Si substrate. The oxide layer 806 is formed for the purpose of lowering the interfacial level of the monocrystalline Si layer 802 which is the final active layer. In this case, another Si substrate may have an oxide layer thereon, or not.

Prior to the etching, an etching preventing film 805 of Si$_3$N$_4$ may be deposited, if necessary, to cover the entire of the two bonded Si substrates, and the Si$_3$N$_4$ on the porous layer only is removed. In place of the Si$_3$N$_4$ layer, Apiezon Wax may be used as the etching protection film. Later, the porous Si substrate 801 is completely removed by etching, leaving the thin monocrystalline Si layer 802 on the SiO$_2$.

Prior to the etching, the porous Si substrate 801 may be made thin by mechanical working such as polishing or grinding from the backside. In particular, when not the entire Si substrate is made porous, the substrate is preferably made thin by mechanical processing so as to expose the porous layer.

Figure 8C:
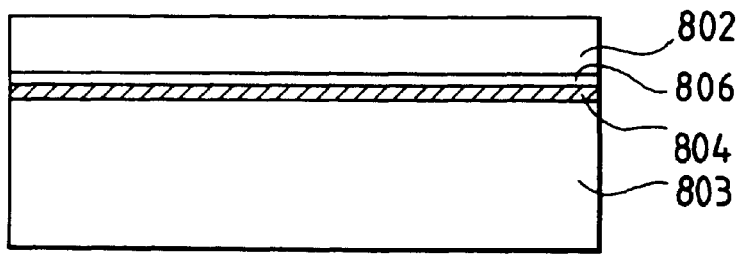

FIG. 8C shows a semiconductor substrate provided according to the present invention. After removal of the etching preventing film 805 of Si$_3$N$_4$, a monocrystalline Si layer 802 having crystallinity in the same level as of a silicon wafer is formed in a form of flat uniform thin film in a large area over the entire area of the wafer. If necessary, the thin monocrystal layer made thicker by epitaxial growth on the monocrystalline Si layer. The growth may be conducted in any method including CVD, sputtering, liquid-phase growth, and solid-phase growth.

Embodiment 6

Figure 9A:
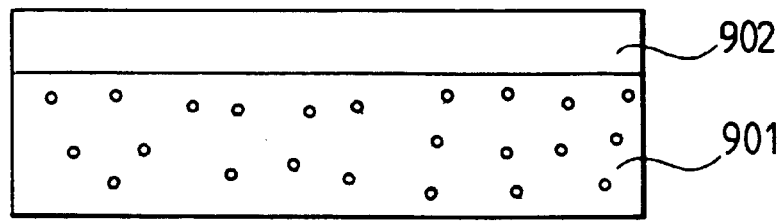
Figure 9B:
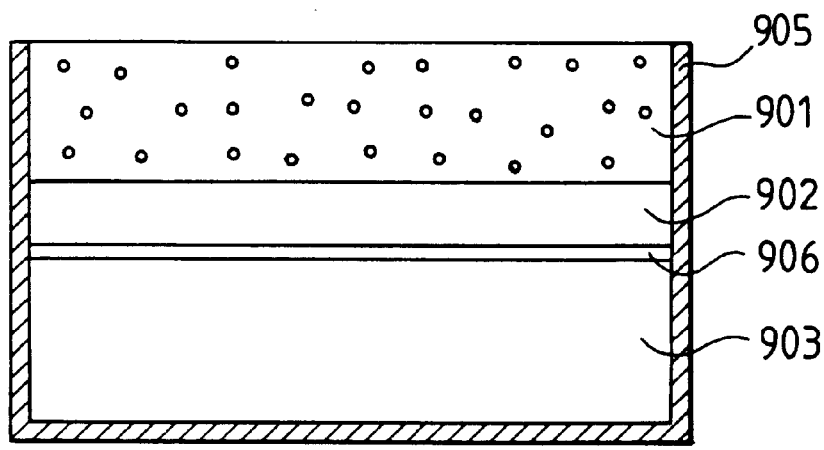
Figure 9C:
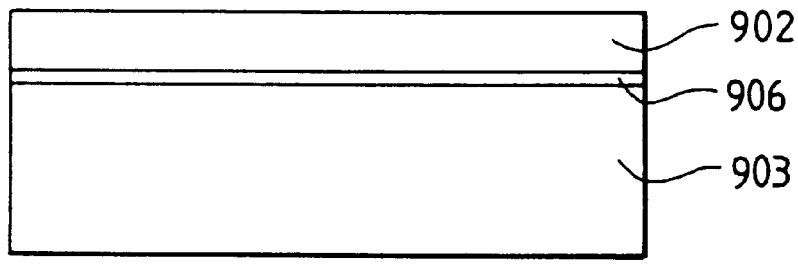

A monocrystalline Si substrate is made porous as shown in FIG. 9A. In the porous structure formation, the entire, the front surface, or the both surfaces of the substrate may be made porous. Then, the substrate is heat-treated in a reducing atmosphere or in vacuo at a temperature lower than the melting point of the Si substrate to transform the surface layer of the porous monocrystalline Si substrate 901 into a thin nonporous monocrystal layer 902.

Figure 11:
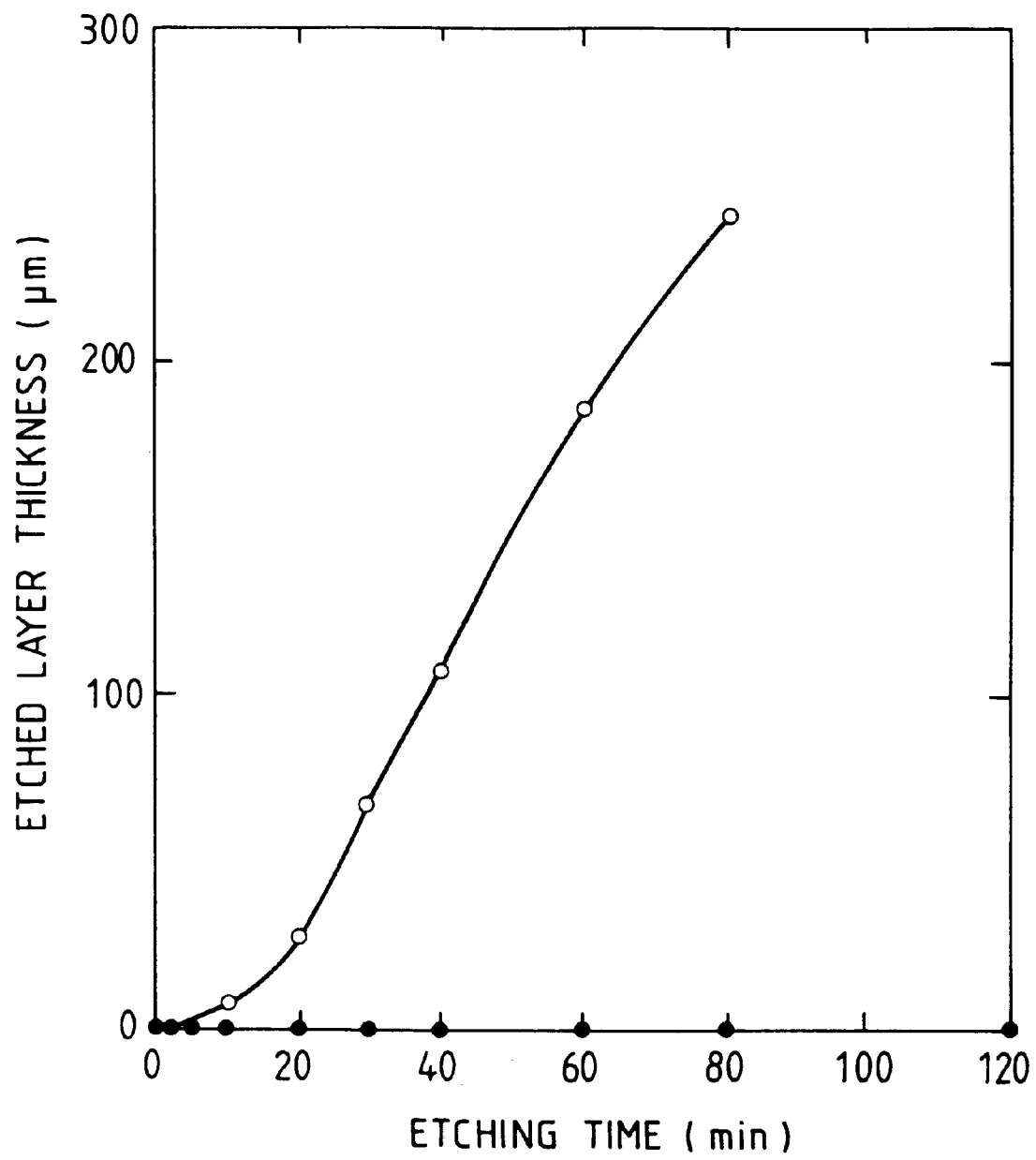

FIG. 11 shows the dependency of the thickness by etching of the porous Si and that of the monocrystalline Si on etching time in the case where the porous Si and the monocrystalline Si are immersed in a mixture of hydrofluoric acid, alcohol, and an aqueous hydrogen peroxide solution without stirring.

The porous structure formation and the etching step are explained specifically.

The porous Si is prepared by anodization of monocrystalline Si. The anodization conditions are shown below. The starting material of the porous Si prepared by anodization is not limited to monocrystalline Si, but may be Si of any other crystal structure.

Applied voltage: 2.6 V
Current density: 30 mA·cm$^{-2}$
Anodization solution: HF:H$_2$O:C$_2$H$_5$OH=1:1:1
Time: 2.4 hours
Porous Si thickness: 300 μm
Porosity: 56%

The porous Si prepared under the above conditions was immersed in a 10:6:50 mixture of 49% hydrofluoric acid, alcohol, and aqueous hydrogen peroxide solution at room temperature without stirring. The decrease of the thickness of the porous Si was measured later. The progress of the etching is shown by blank circles (○) in FIG. 11. The porous Si was etched rapidly (107 μm in 40 minutes and 244 μm in 80 minutes) uniformly with retention of satisfactory surface property. The etching rate depends on the concentration of the solution and the temperature.

Separately, nonporous Si of 500 μm thick was immersed in the 10:6:50 mixture of 49% hydrofluoric acid, alcohol, and aqueous hydrogen peroxide solution at room temperature without stirring. The decrease of the thickness was measured later. The progress of the etching is shown by solid circles (●) in FIG. 10. The nonporous Si was etched by not more than 100 Å even after 120 minutes of etching.

Subsequently, a light-transmissive glass substrate 903 is bonded to the surface of the monocrystalline Si layer 902 on the porous Si substrate 901. The bonding is conducted by bringing the cleaned surfaces into contact with each other and then heating in an oxygen atmosphere or a nitrogen atmosphere.

Prior to the bonding, an oxide layer 906 may be formed on the nonporous monocrystalline silicon layer 902. The oxide layer 906 is formed for the purpose of lowering the interfacial level of the monocrystalline Si layer 902 which is the final active layer.

Prior to the etching, an etching protection film 905 of Si$_3$N$_4$ may be deposited, if necessary, to cover the entire of the two bonded Si substrates, and the Si$_3$N$_4$ on the porous layer only is removed. In place of the Si$_3$N$_4$ layer, Apiezon Wax may be used as the etching protection film. Later, the porous Si substrate 901 is completely removed by etching, leaving the thin monocrystalline Si layer 902 on the light-transmissive glass 903.

Prior to the etching, the porous Si substrate 901 may be made thin by mechanical working such as polishing or grinding from the backside. Particularly when not the entire Si substrate is made porous, the substrate is preferably made thin by mechanical processing so as to expose the porous layer.

The present invention is explained by reference to specific examples without limiting the invention thereto in any way.

EXAMPLE 1

A 4-inch monocrystalline (100) silicon wafer which has irregularity of about 30 nm in height in a cycle of about 50 nm on the surface observed by interatomic force microscopy was placed in a heat treatment furnace. The furnace was evacuated to a vacuum of 0.01 Torr, and thereto gaseous hydrogen was introduced. The silicon wafer was heat-treated at a temperature of 950° C. and a pressure of 80 Torr. The surface was observed by interatomic force microscopy, and the surface roughness of 30 nm before the hydrogen treatment was found to have been improved to 1.5 nm.

The treated Si layer was confirmed to have no crystal defect newly introduced and have satisfactory crystallinity by observation of cross section by transmission electron microscopy.

EXAMPLE 2

A 4-inch monocrystalline (110) silicon wafer which has irregularity of about 30 nm in height in a cycle of about 50 nm on the surface observed by interatomic force microscopy was placed in a heat treatment furnace. Gaseous hydrogen was introduced into the furnace. The silicon wafer was kept standing for 10 minutes, and then heat-treated at a temperature of 1150° C. and a pressure of 760 Torr. The surface was observed by interatomic force microscopy, and the roughness of 30 nm before the hydrogen treatment was found to have been improved to 1.6 nm.

The treated Si layer was confirmed to have no crystal defect newly introduced and have satisfactory crystallinity by observation of cross section by transmission electron microscopy.

EXAMPLE 3

A 4-inch 4°-off monocrystalline (100) silicon wafer which has irregularity of about 30 nm in height in a cycle of about 50 nm on the surface observed by interatomic force microscopy was placed in a heat treatment furnace. The furnace was evacuated to a vacuum of 0.01 Torr, and thereto gaseous hydrogen was introduced. The silicon wafer was heat-treated at a temperature of 900° C. and a pressure of 10 Torr. The surface was observed by interatomic force microscopy and the surface roughness of 30 nm before the hydrogen treatment was found to have been improved to 1.7 nm.

The treated Si layer was confirmed to have no crystal defect newly introduced and have satisfactory crystallinity by observation of cross section by transmission electron microscopy.

EXAMPLE 4

A 4-inch monocrystalline (111) silicon wafer which has irregularity of about 30 nm in height in a cycle of about 50 nm on the surface observed by interatomic force microscopy was placed in a heat treatment furnace. The furnace was evacuated to a vacuum of 0.01 Torr, and thereto gaseous hydrogen was introduced. The silicon wafer was heat-treated at a temperature of 1100° C. and a pressure of 760 Torr. The surface was observed by interatomic force microscopy, and the roughness of 30 nm before the hydrogen treatment was found to have been improved to 1.7 nm.

The treated Si layer was confirmed to have no crystal defect newly introduced and have satisfactory crystallinity by observation of cross section by transmission electron microscopy.

EXAMPLE 5

A 4-inch 4-inch 4°-off monocrystalline (111) silicon wafer which has irregularity of about 30 nm in height in a cycle of about 50 nm on the surface observed by interatomic force microscopy was placed in a heat treatment furnace. The furnace was evacuated to a vacuum of 0.01 Torr, and thereto a gas mixture of nitrogen 90% and hydrogen 10% was introduced. The silicon wafer was heat-treated at a temperature of 950° C. and a pressure of 50 Torr. The surface was observed by interatomic force microscopy, and the surface roughness of 30 nm before the hydrogen treatment was found to have been improved to 1.9 nm.

The treated Si layer was confirmed to have no crystal defect newly introduced and have satisfactory crystallinity by observation of cross section by transmission electron microscopy.

EXAMPLE 6

A 4-inch monocrystalline (100) silicon wafer which has irregularity of about 30 nm in height in a cycle of about 50 nm on the surface observed by interatomic force microscopy was placed in a heat treatment furnace. Thereto a gas mixture of nitrogen 90% and hydrogen 10% was introduced. The silicon wafer was kept standing for 15 minutes, and then heat-treated at a temperature of 700° C. and a pressure of 0.1 Torr. The surface was observed by interatomic force microscopy, and the surface roughness of 30 nm before the hydrogen treatment was found to have been improved to 1.7 nm.

The treated Si layer was confirmed to have no crystal defect newly introduced and have satisfactory crystallinity by observation of cross section by transmission electron microscopy.

EXAMPLE 7

A sample was provided which had on the surface an exposed monocrystalline (100) silicon area of 100 $\mu$m square and was covered in other area with a silicon nitride film. The exposed silicon area had irregularity of about 30 nm in height in a cycle of about 50 nm on the surface observed by interatomic force microscopy. The sample was placed in a heat treatment furnace. Thereto a gas mixture of nitrogen 90% and hydrogen 10% was introduced, and the atmosphere in the furnace was completely replaced. The sample was then heat-treated at a temperature of 1100° C. and a pressure of 100 Torr. The surface was observed by interatomic force microscopy, and the surface roughness of 30 nm before the hydrogen treatment was found to have been improved to 1.7 nm.

The treated Si layer was confirmed to have no crystal defect newly introduced and have satisfactory crystallinity by observation of cross section by transmission electron microscopy.

EXAMPLE 8

A monocrystalline P-type (100) Si substrate of 600 $\mu$m thick was anodized in 50% HF solution for 20 minutes at a current density of 12 mA/cm$^2$. The porous structure was formed at a rate of 1.1 $\mu$m/min. The P-type (100) Si substrate of 600 $\mu$m thick was made porous to a depth of about 20 $\mu$m.

On the porous P-type (100) Si substrate, an epitaxial Si layer was grown in a thickness of 2 $\mu$m by CVD under the deposition conditions below:

Temperature: 950° C.
Pressure: 80 Torr
Gas: SiH$_2$Cl$_2$/H$_2$, 0.5/180 (l/min)
Growth rate: 0.33 nm/sec This Si substrate was heat-treated at 950° C. in a hydrogen atmosphere at 80 Torr. The treated sample was evaluated for surface flatness by interatomic microscope observation. The surface roughness before the hydrogen treatment of 20 nm was found to be improved to 1.5 nm.

The surface of the epitaxial layer was thermally oxidized in a depth of 50 nm. On the thermally oxidation film, another monocrystalline silicon substrate was superposed and the combined substrates were heated in a nitrogen atmosphere at 1000° C. for 2 hours, whereby the two substrates were bonded tightly.

The substrate having been made porous was polished on the backside to remove the nonporous portion of the silicon substrate to uncover the porous layer.

The bonded substrates were selectively etched by immersion in a mixture of hydrofluoric acid, alcohol, and aqueous hydrogen peroxide solution (10:6:50) without stirring. In 20 minutes, the porous Si substrate only was selectively etched and removed completely with the monocrystalline Si layer left unetched as an etch-stop material.

The rate of etching of the nonporous Si layer by the etching solution is as low as about 40 Å or a little less for 20 minutes. Therefore, the relative rate of selective etching of the porous layer to that of nonporous layer is $10^5$ or more, and the decrease of the film thickness of the nonporous layer (several tens of Å) by etching was practicably negligible.

Consequently, the porous Si substrate of 200 $\mu$m in thickness was removed, and monocrystalline Si layer of 0.5 $\mu$m thick was formed uniformly with no defect on the silicon oxide surface of the silicon substrate. Unbonded spots were found at a spot density of 0.5 spot/cm$^2$ in comparison with 50 spots/cm$^2$ in the case where the heat treatment in hydrogen atmosphere was not conducted.

The resulting Si layer was found to have no crystal defect newly introduced and have satisfactory crystallinity by observation of cross-section by transmission electron microscopy.

EXAMPLE 9

A monocrystalline P-type (100) Si substrate of 200 $\mu$m thick was anodized in 50% HF solution at a current density of 110 mA/cm$^2$. The porous structure was formed at a rate of 8.7 $\mu$m/min. The entire of the P-type (100) Si substrate of 200 $\mu$m thick was made porous in 23 minutes.

On the porous P-type (100) Si substrate, an epitaxial Si layer was grown in a thickness of 0.5 $\mu$m by MBE (molecular beam epitaxy) at a low temperature under the deposition conditions below:

Temperature: 700° C.
Pressure: 5×10$^{-8}$ Torr
Growth rate: 0.1 nm/sec

This Si substrate was heat-treated at 950° C. in a hydrogen atmosphere at 80 Torr. The treated sample was evaluated for surface flatness by interatomic microscope observation. The surface roughness before the hydrogen treatment of 15 nm was found to be improved to 1.5 nm.

The surface of the epitaxial layer was thermally oxidized in a depth of 100 nm. On the thermally oxidation film, another monocrystalline silicon substrate was superposed and the combined substrates were heated in an oxygen atmosphere at 900° C. for 2 hours, whereby the two substrates were bonded tightly.

The bonded two substrates were covered by deposition of Si$_3$N$_4$ in a thickness of 0.1 $\mu$m by plasma CVD. Then the nitride film on the porous substrate only was removed by reactive ion etching.

The bonded substrates were selectively etched by immersion in a mixture of buffered hydrofluoric acid, alcohol, and aqueous hydrogen peroxide solution (10:6:50) without stirring. In 204 minutes, the porous Si substrate only was selectively etched and removed completely with the monocrystalline Si layer left unetched as an etch-stop material.

The rate of etching of the nonporous Si layer by the etching solution is as low as about 40 Å or a little less for 204 minutes. Therefore, the relative rate of selective etching of the porous layer to that of nonporous layer is $10^5$ or more, and the decrease of the film thickness of the nonporous layer (several tens of Å) by etching was practicably negligible.

Consequently, the porous Si substrate of 200 μm was removed, and after removal of the $Si_3N_4$ layer, monocrystalline Si layer of 0.5 μm thick was formed uniformly with no defect on the silicon oxide surface of the silicon substrate.

The resulting Si layer was found to have no crystal defect newly introduced and have satisfactory crystallinity by observation of cross-section by transmission electron microscopy.

EXAMPLE 10

A monocrystalline P-type (100) Si substrate of 200 μm thick was anodized in 50% HF solution at a current density of 110 mA/cm². The porous structure was formed at a rate of 8.7 μm/min. The entire of the P-type (100) Si substrate of 200 μm thick was made porous in 23 minutes.

On the porous P-type (100) Si substrate, an epitaxial Si layer was grown in a thickness of 5 μm by plasma CVD at a low temperature under the deposition conditions below:

Gas: $SiH_4$
High frequency power: 120 W
Temperature: 800° C.
Pressure: $1\times10^{-2}$ Torr
Growth rate: 2.7 nm/sec This Si substrate was heat-treated at 1000° C. in a hydrogen atmosphere at 760 Torr. The treated sample was evaluated for surface flatness by interatomic microscope observation. The surface roughness before the hydrogen treatment of 25 nm was found to be improved to 1.6 nm.

The surface of the epitaxial layer was thermally oxidized in a depth of 50 nm. On the thermally oxidation film, a fused silica substrate having been optically polished was superposed and the combined substrates were heated in an oxygen atmosphere at 400° C. for 20 hours, whereby the two substrates were bonded tightly.

The bonded substrates were selectively etched by immersion in a mixture of hydrofluoric acid and aqueous hydrogen peroxide solution (1:5) with stirring. In 62 minutes, the porous Si substrate was selectively etched and removed completely with the monocrystalline Si left unetched as an etch-stop material.

The rate of etching of the nonporous Si layer by the above etching solution is as low as about 20 Å or a little less for 62 minutes. Therefore, the relative rate of selective etching of the porous layer to that of nonporous layer is $10^5$ or more, and the decrease of the film thickness of the nonporous layer (several tens of Å) by etching was practicably negligible.

Consequently, the porous Si substrate of 200 μm thick was removed, and a monocrystalline Si layer of 0.5 μm thick was formed uniformly with no defect on the fused silica substrate.

The resulting Si layer was found to have no crystal defect newly introduced and have satisfactory crystallinity by observation of cross-section by transmission electron microscopy.

EXAMPLE 11

A monocrystalline P-type (100) Si substrate of 200 μm thick was anodized in 50% HF solution at a current density of 110 mA/cm². The porous structure was formed at a rate of 8.7 μm/min. The entire of the P-type (100) Si substrate of 200 μm thick was made porous in 23 minutes.

On the porous P-type (100) Si substrate, an epitaxial Si layer was grown in a thickness of 1 μm by CVD at a low temperature under the deposition conditions below:

Gas: $SiH_4$ (0.6 l/min), $H_2$ (100 l/min)
Temperature: 850° C.
Pressure: 40 Torr
Growth rate: 0.3 μm/min This Si substrate was heat-treated at 900° C. in a hydrogen atmosphere at 10 Torr. The treated sample was evaluated for surface flatness by interatomic microscope observation. The surface roughness before the hydrogen treatment of 18 nm was found to be improved to 1.6 nm.

The surface of the epitaxial layer was thermally oxidized in a depth of 50 nm. On the thermally oxidation film, an optically polished glass substrate having a softening point of about 500° C. was superposed and the combined substrates were heated in an oxygen atmosphere at 450° C. for 0.5 hour, whereby the two substrates were bonded tightly.

The bonded substrates were selectively etched by immersion in a mixture of buffered hydrofluoric acid, alcohol, and aqueous hydrogen peroxide solution (10:6:50) without stirring. In 204 minutes, the porous Si substrate was selectively etched and removed completely with the monocrystalline Si left unetched as an etch-stop material.

The rate of etching of the nonporous Si layer by the above etching solution is as low as about 40 Å or a little less for 204 minutes. Therefore, the relative rate of selective etching of the porous layer to that of nonporous layer is $10^5$ or more, and the decrease of the film thickness of the nonporous layer (several tens of Å) by etching was practicably negligible.

Consequently, the porous Si substrate of 200 μm thick was removed, and a monocrystalline Si layer of 1 μm thick was formed uniformly with no defect on the glass substrate of a low softening point.

The resulting Si layer was found to have no crystal defect newly introduced and have satisfactory crystallinity by observation of cross-section by transmission electron microscopy.

EXAMPLE 12

A monocrystalline P-type (100) Si substrate of 525 μm thick was anodized in 50% HF solution for 20 minutes at a current density of 12 mA/cm². The porous structure was formed at a rate of 1.1 μm/min. The P-type (100) Si substrate of 525 μm thick was made porous to a depth of 20 μm.

The partially porous substrate was heat-treated in an oxygen atmosphere at 300° C. for one hour.

On the porous face of the P-type (100) Si substrate, an epitaxial Si layer was grown in a thickness of 5.0 μm at a low temperature by bias sputtering under the deposition conditions below:

RF frequency: 100 MHz
High frequency power: 600 W
Temperature: 300° C.
Ar gas pressure: $8\times10^{-3}$ Torr
Growth time: 120 minutes
Target DC bias: −200 V
Substrate DC bias: +10 V This Si substrate was heat-treated at 900° C. in a hydrogen atmosphere at 10 Torr. The treated sample was evaluated for surface flatness by interatomic microscope observation. The surface roughness before the hydrogen treatment of 13 nm was found to be improved to 1.4 nm.

On the surface of the epitaxial layer, was formed a silicon oxide layer of 500 nm thick by thermal oxidation. On the thermally oxidation film, another silicon substrate was superposed and the combined substrates were heated in a nitrogen atmosphere at 1000° C. for 2 hours, whereby the two substrates were bonded tightly.

The substrate having been made porous was polished on the backside to remove the nonporous portion of the silicon substrate to uncover the porous layer.

The bonded substrates were selectively etched by immersion in a mixture of buffered hydrofluoric acid, alcohol, and aqueous hydrogen peroxide solution (10:6:50) without stirring. In 20 minutes, the porous Si substrate only was selectively-etched and removed completely with the monocrystalline Si layer left unetched as an etch-stop material.

The rate of etching of the nonporous Si layer by the etching solution is as low as about 40 Å or a little less for 204 minutes. Therefore, the relative rate of selective etching of the porous layer to that of nonporous layer is $10^5$ or more, and the decrease of the film thickness of the nonporous layer (several tens of Å) by etching was practicably negligible.

Consequently, the 20 $\mu$m-thick porous Si substrate was removed, and a monocrystalline Si layer of 0.75 $\mu$m thick was formed uniformly with no defect on the 500 nm thick silicon oxide layer on the silicon substrate.

The resulting Si layer was found to have no crystal defect newly introduced and have satisfactory crystallinity by observation of cross-section by transmission electron microscopy.

EXAMPLE 13

A monocrystalline P-type (100) Si substrate of 600 $\mu$m thick was anodized in 50% HF solution at a current density of 14 mA/cm$^2$. The porous structure was formed at a rate of 1.3 $\mu$m/min. The P-type (100) Si substrate of 600 $\mu$m thick was made porous to a depth of 20 $\mu$m.

On the porous face of the P-type (100) Si substrate, an epitaxial Si layer was grown in a thickness of 10 $\mu$m at a low temperature by liquid-phase growth under the growth conditions below:

Solvent: Sn
Growth temperature: 900° C.
Growth atmosphere: H$_2$
Growth time: 20 minutes This Si substrate was heat-treated at 950° C. in a hydrogen atmosphere at 80 Torr. The treated sample was evaluated for surface flatness by interatomic microscope observation. The surface roughness before the hydrogen treatment of 30 nm was found to be improved to 1.8 nm.

On the surface of another monocrystalline silicon substrate, was formed a silicon oxide layer of 1 $\mu$m thick. This silicon substrate at the silicon oxide layer side was superposed on the aforementioned epitaxial Si layer, and the combined substrates were heated in a nitrogen atmosphere at 700° C. for 5 hours, whereby the two substrates were bonded tightly.

The substrate having been made porous was polished on the backside to remove the nonporous portion of the silicon substrate to uncover the porous layer.

The bonded substrates were selectively etched by immersion in a mixture of buffered hydrofluoric acid, alcohol, and aqueous hydrogen peroxide solution (10:6:50) without stirring. In 20 minutes, the porous Si substrate only was selectively etched and removed completely with the monocrystalline Si layer left unetched as an etch-stop material.

The rate of etching of the nonporous Si layer by the etching solution is as low as about 10 Å or less for 20 minutes. Therefore, the relative rate of selective etching of the porous layer to that of nonporous layer is $10^5$ or more, and the decrease of the film thickness of the nonporous layer (several tens of Å) by etching was practicably negligible.

Consequently, the Si substrate made porous was removed, and a monocrystalline Si layer of 10 $\mu$m thick was formed uniformly with no defect on the silicon substrate.

The resulting Si layer was found to have no crystal defect newly introduced and have satisfactory crystallinity by observation of cross-section by transmission electron microscopy.

EXAMPLE 14

On a P-type (100) Si substrate of 200 $\mu$m thick, an N-type Si layer of 1 $\mu$m thick was formed by proton ion implantation in an H$^+$ implantation quantity of 5×10$^{15}$ (ions/cm$^2$). This substrate was anodized in 50% HF solution at a current density of 100 mA/cm$^2$. The porous structure was formed at a rate of 8.4 $\mu$m/min. The entire of the P-type (100) Si substrate of 200 $\mu$m thick was made porous in 24 minutes. In the anodization, the P-type (100) Si substrate only was made porous with the N-type Si layer unchanged.

This Si substrate was heat-treated at 950° C. in a hydrogen atmosphere at 80 Torr. The treated sample was evaluated for surface flatness by interatomic microscope observation. The surface roughness before the hydrogen treatment of 13 nm was found to be improved to 1.1 nm.

The surface of the N-type monocrystal layer was thermally oxidized in a depth of 50 nm. On the thermally oxidation film, a fused silica substrate having been optically polished was superposed and the combined substrates were heated in an oxygen atmosphere at 800° C. for 0.5 hour, whereby the two substrates were bonded tightly.

The bonded two substrates were covered by deposition of Si$_3$N$_4$ in a thickness of 0.1 $\mu$m by low-pressure CVD. Then the nitride film on the porous substrate only was removed by reactive ion etching. Then the bonded substrates were selectively etched by immersion in a mixture of buffered hydrofluoric acid, alcohol, and aqueous hydrogen peroxide solution (10:6:50) without stirring. In 204 minutes, the porous Si substrate was selectively etched and removed completely with the monocrystalline Si layer left unetched as an etch-stop material.

The rate of etching of the nonporous Si layer by the etching solution is as low as about 40 Å or a little less for 204 minutes. Therefore, the relative rate of selective etching of the porous layer to that of nonporous layer is $10^5$ or more, and the decrease of the film thickness of the nonporous layer (several tens of Å) by etching was practicably negligible.

Consequently, the porous Si substrate of 200 $\mu$m was removed, and after removal of the Si$_3$N$_4$ layer, monocrystalline Si layer of 1.0 $\mu$m thick was formed uniformly with no defect on the silicon oxide surface of the silicon substrate.

EXAMPLE 15

A monocrystalline P-type (100) Si substrate of 600 $\mu$m thick was anodized in 50% HF solution for 20 minutes at a current density of 5 mA/cm$^2$. The porous structure was formed at a rate of 1 $\mu$m/min. The P-type (100) Si substrate of 600 $\mu$m thick was made porous to a depth of about 20 $\mu$m.

On the porous P-type (100) Si substrate, an epitaxial Si layer was grown in a thickness of 2 μm by CVD under the deposition conditions below:

Temperature: 950° C.
Pressure: 80 Torr
Gas: $SiH_2Cl_2/H_2$, 0.5/180 (l/min)
Growth rate: 0.33 nm/sec The surface of this epitaxial layer was thermally oxidized to a depth of 50 nm. On the thermally oxidation film, another monocrystalline silicon substrate was superposed and the combined substrates were heated in a nitrogen atmosphere at 1000° C. for 2 hours, whereby the two substrates were bonded tightly.

The substrate having been made porous was polished on the backside to remove the nonporous portion of the silicon substrate to uncover the porous layer.

The bonded substrates were selectively etched by immersion in a mixture of hydrofluoric acid, alcohol, and aqueous hydrogen peroxide solution (10:6:50) without stirring. In 20 minutes, the porous Si substrate only was selectively etched and removed completely with the monocrystalline Si layer left unetched as an etch-stop material.

The rate of etching of the nonporous Si layer by the etching solution is as low as about 40 Å or a little less for 204 minutes. Therefore, the relative rate of selective etching of the porous layer to that of nonporous layer is $10^5$ or more, and the decrease of the film thickness of the nonporous layer (several tens of Å) by etching was practicably negligible.

Consequently, the porous Si substrate of 20 μm thick was removed, and monocrystalline Si layer of 0.5 μm thick was formed on the silicon oxide surface on the silicon substrate after removal of the $Si_3N_4$ layer.

This substrate was heat-treated at 950° C. in a hydrogen atmosphere at 80 Torr. The treated sample was evaluated for surface flatness by interatomic microscope observation. The surface roughness before the hydrogen treatment of 20 nm was found to have been improved to 1.5 nm.

The resulting Si layer was found to have no crystal defect newly introduced and have satisfactory crystallinity by observation of cross-section by transmission electron microscopy.

EXAMPLE 16

A monocrystalline p-type (100) Si substrate of 200 μm thick was anodized in 50% HF solution at a current density of 100 mA/cm². The porous structure was formed at a rate of 8.4 μm/min. The entire of the P-type (100) Si substrate of 200 μm thick was made porous in 24 minutes.

The porous substrate was heat-treated in an oxygen atmosphere at 300° C. for one hour.

On the porous P-type (100) Si substrate, an epitaxial Si layer was grown in a thickness of 0.5 μm by MBE (molecular beam epitaxy) at a low temperature under the deposition conditions below:

Temperature: 700° C.
Pressure: $1 \times 10^{-9}$ Torr
Growth rate: 0.1 nm/sec

The surface of the epitaxial layer was thermally oxidized to a depth of 100 nm. On the thermally oxidation film, another monocrystalline silicon substrate was superposed and the combined substrates were heated in an oxygen atmosphere at 900° C. for 2 hours, whereby the two substrates were bonded tightly.

The bonded two substrates were covered by deposition of $Si_3N_4$ in a thickness of 0.1 μm by plasma CVD. Then the nitride film on the porous substrate only was removed by reactive ion etching.

The bonded substrates were selectively etched by immersion in a mixture of buffered hydrofluoric acid, alcohol, and aqueous hydrogen peroxide solution (10:6:50) without stirring. In 204 minutes, the porous Si substrate only was selectively etched and removed completely with the monocrystalline Si layer left unetched as an etch-stop material.

The rate of etching of the nonporous monocrystalline Si layer by the etching solution is as low as about 40 Å or a little less for 204 minutes. Therefore, the relative rate of selective etching of the porous layer to that of nonporous layer is $10^5$ or more, and the decrease of the film thickness of the nonporous layer (several tens of Å) by etching was practicably negligible.

Consequently, the porous Si substrate of 200 μm was removed, and after removal of the $Si_3N_4$ layer, monocrystalline Si layer of 0.5 μm thick was formed uniformly with no defect on the silicon oxide surface of the silicon substrate.

This silicon substrate was heat-treated at 950° C. in a hydrogen atmosphere at 80 Torr. The treated sample was evaluated for surface flatness by interatomic microscope observation. The surface roughness before the hydrogen treatment of 20 nm was improved to 1.5 nm.

Embodiment 17

A monocrystalline P-type (100) Si substrate of 200 μm thick was anodized in 50% HF solution at a current density of 100 mA/cm². The porous structure was formed at a rate of 8.4 μm/min. The entire of the P-type (100) Si substrate of 200 μm thick was made porous in 24 minutes.

On the porous P-type (100) Si substrate, an epitaxial Si layer was grown in a thickness of 5 μm by plasma CVD at a low temperature under the deposition conditions below:

Gas: $SiH_4$
High frequency power: 100 W
Temperature: 800° C.
Pressure: $1 \times 10^{-1}$ Torr
Growth rate: 2.5 nm/sec The surface of the epitaxial layer was thermally oxidized to a depth of 50 nm. On the thermally oxidation film, a fused silica substrate having been optically polished was superposed and the combined substrates were heated in an oxygen atmosphere at 400° C. for 20 hours, whereby the two substrates were bonded tightly.

The bonded substrates were selectively etched by immersion in a mixture of hydrofluoric acid and aqueous hydrogen peroxide solution (1:5) with stirring. In 62 minutes, the porous Si substrate was selectively etched and removed completely with the monocrystalline Si left unetched as an etch-stop material.

The rate of etching of the nonporous Si layer by the above etching solution is as low as about 20 Å or a little less for 62 minutes. Therefore, the relative rate of selective etching of the porous layer to that of nonporous layer is $10^5$ or more, and the decrease of the film thickness of the nonporous layer (several tens of Å) by etching was practicably negligible.

Consequently, the porous Si substrate of 200 μm thick was removed, and a monocrystalline Si layer of 5 μm thick was formed on the fused silica substrate.

The fused silica substrate having the monocrystalline Si layer was heat-treated at 1000° C. in a hydrogen atmosphere at 760 Torr. The treated sample was evaluated for surface flatness by interatomic microscope observation. The surface roughness before the hydrogen treatment of 20 nm was improved to 1.6 nm.

The resulting Si layer was found to have no crystal defect newly introduced and have satisfactory crystallinity by observation of cross-section by transmission electron microscopy.

EXAMPLE 18

A monocrystalline P-type (100) Si substrate of 200 μm thick was anodized in 50% HF solution at a current density of 100 mA/cm$^2$. The porous structure was formed at a rate of 8.4 μm/min. The entire of the P-type (100) Si substrate of 200 μm thick was made porous in 24 minutes.

On the porous P-type (100) Si substrate, an epitaxial Si layer was grown in a thickness of 1 μm by CVD at a low temperature under the deposition conditions below:

Gas: SiH$_4$ (0.6 l/min), H$_2$ (100 l/min)
Temperature: 850° C.
Pressure: 40 Torr
Growth rate: 0.3 μm/min The surface of the epitaxial layer was thermally oxidized to a depth of 50 nm. On the thermally oxidation film, an optically polished glass substrate having a softening point of about 500° C. was superposed and the combined substrates were heated in an oxygen atmosphere at 450° C. for 0.5 hour, whereby the two substrates were bonded tightly.

The bonded substrates were selectively etched by immersion in a mixture of buffered hydrofluoric acid, alcohol, and aqueous hydrogen peroxide solution (10:6:50) without stirring. In 204 minutes, the porous Si substrate was selectively etched and removed completely with the monocrystalline Si left unetched as an etch-stop material.

The rate of etching of the nonporous Si layer by the above etching solution is as low as about 40 Å or a little less for 204 minutes. Therefore, the relative rate of selective etching of the porous layer to that of nonporous layer is 10$^5$ or more, and the decrease of the film thickness of the nonporous layer (several tens of Å) by etching was practicably negligible. Consequently, the porous Si substrate of 200 μm thick was removed, and a monocrystalline Si layer of 1 μm thick was formed on the glass substrate of a low softening point.

This substrate was heat-treated at 900° C. in a hydrogen atmosphere at 10 Torr. The treated sample was evaluated for surface flatness by interatomic microscope observation. The surface roughness before the hydrogen treatment of 20 nm was improved to 1.7 nm.

The resulting Si layer was found to have no crystal defect newly introduced and have satisfactory crystallinity by observation of cross-section by transmission electron microscopy.

EXAMPLE 19

A monocrystalline P-type (100) Si substrate of 525 μm thick was anodized in 50% HF solution at a current density of 5 mA/cm$^2$. The porous structure was formed at a rate of 1 μm/min. The P-type (100) Si substrate of 525 μm thick was made porous to a depth of 20 μm.

The partially porous substrate was heat-treated in an oxygen atmosphere at 300° C. for one hour.

On the porous face of the P-type (100) Si substrate, an epitaxial Si layer was grown in a thickness of 1.0 μm at a low temperature by bias sputtering under the deposition conditions below:

RF frequency: 100 MHz
High frequency power: 600 W
Temperature: 300° C.
Ar gas pressure: 8×10$^{-3}$ Torr
Growth time: 120 minutes
Target DC bias: −200 V
Substrate DC bias: +5 V On the surface of the epitaxial layer, was formed a silicon oxide layer of 500 nm thick by thermal oxidation. On the thermally oxidation film, another silicon substrate was superposed and the combined substrates were heated in a nitrogen atmosphere at 1000° C. for 2 hours, whereby the two substrates were bonded tightly.

The substrate having been made porous was polished on the backside to remove the nonporous portion of the silicon substrate to uncover the porous layer.

The bonded substrates were selectively etched by immersion in a mixture of buffered hydrofluoric acid, alcohol, and aqueous hydrogen peroxide solution (10:6:50) without stirring. In 20 minutes, the porous Si substrate only was selectively etched and removed completely with the monocrystalline Si layer left unetched as an etch-stop material.

The rate of etching of the nonporous Si layer by the etching solution is as low as about 40 Å or a little less for 204 minutes. Therefore, the relative rate of selective etching of the porous layer to that of nonporous layer is 10$^5$ or more, and the decrease of the film thickness of the nonporous layer (several tens of Å) by etching was practicably negligible. consequently, the 20 μm thick Si substrate made porous was removed, and a monocrystalline Si layer of 0.75 μm thick was formed on the 500 nm thick silicon oxide layer of the silicon substrate.

The substrate was heat-treated at 900° C. in a hydrogen atmosphere at 10 Torr. The treated sample was evaluated for surface flatness by interatomic microscope observation. The surface roughness before the hydrogen treatment of 13 nm was found to be improved to 1.4 nm.

The resulting Si layer was found to have no crystal defect newly introduced and have satisfactory crystallinity by observation of cross-section by transmission electron microscopy.

EXAMPLE 20

A monocrystalline P-type (100) Si substrate of 600 μm thick was anodized in 50% HF solution at a current density of 5 mA/cm$^2$. The -porous structure was formed at a rate of 1 μm/min. The P-type (100) Si substrate of 600 μm thick was made porous to a depth of 20 μm.

On the porous face of the P-type (100) Si substrate, an epitaxial Si layer was grown in a thickness of 10 μm at a low temperature by liquid-phase growth under the growth conditions below:

Solvent: Sn
Growth temperature: 900° C.
Growth atmosphere: H$_2$
Growth time: 20 minutes On the surface of the epitaxial Si layer, another monocrystalline silicon substrate was superposed which has a silicon oxide layer of 1 μm thick on the surface, and the combined substrates were heated in an oxygen atmosphere at 700° C. for 5 hours, whereby the two substrates were bonded tightly.

The substrate having been made porous was polished on the backside to remove the nonporous portion of the silicon substrate to uncover the porous layer.

The bonded substrates were selectively etched by immersion in a mixture of buffered hydrofluoric acid, alcohol, and aqueous hydrogen peroxide solution (10:6:50) without stirring. In 20 minutes, the porous Si substrate only was selectively etched and removed completely with the monocrystalline Si layer left unetched as an etch-stop material.

The rate of etching of the nonporous Si layer by the etching solution is as low as about 10 Å or less for 20 minutes. Therefore, the relative rate of selective etching of the porous layer to that of nonporous layer is $10^5$ or more, and the decrease of the film thickness of the nonporous layer (several tens of Å) by etching was practicably negligible.

Consequently, the Si substrate made porous was removed, and a monocrystalline Si layer of 10 μm thick was formed on the silicon substrate.

This substrate was heat-treated at 950° C. in a hydrogen atmosphere at 80 Torr. The treated sample was evaluated for surface flatness by interatomic microscope observation. The surface roughness before the hydrogen treatment of 20 nm was improved to 1.7 nm.

The resulting Si layer was found to have no crystal defect newly introduced and have satisfactory crystallinity by observation of cross-section by transmission electron microscopy.

EXAMPLE 21

On a P-type (100) Si substrate of 200 μm thick, an epitaxial Si layer was made to grow to a thickness of 0.5 μm by CVD under the deposition conditions below:

Reactive gas flow rate: $SiH_2Cl_2$, 1000 SCCM $H_2$, 230 l/min

Temperature: 1080° C.

Pressure: 80 Torr

Time: 1 min

This substrate was anodized in a 50 wt % HF solution at a current density of 100 mA/cm². The porous structure formation rate was 8.4 μm/min. The entire of the P-type (100) Si substrate of 200 μm thick was made porous in 24 minutes. In the anodization, the P-type (100) Si substrate only was made porous as described before, and the Si epitaxial layer remained intact.

The surface of the epitaxial layer was thermally oxidized to a depth of 50 nm. On this thermally oxidized layer, a fused silica substrate which had been optically polished was superposed. The superposed two substrates were heated in an oxygen atmosphere at 800° C. for 3 hours, thereby the two substrates being bonded tightly.

The bonded substrates were selectively etched by immersion in a mixture of buffered hydrofluoric acid, alcohol, and aqueous hydrogen peroxide solution (10:6:50) without stirring. In 204 minutes, the porous Si substrate only was selectively etched and removed completely with the monocrystalline Si layer left unetched as an etch-stop material.

The rate of etching of the nonporous Si layer by the etching solution is as low as about 40 Å or less for 204 minutes. Therefore, the relative rate of selective etching of the porous layer to that of nonporous layer is $10^5$ or more, and the decrease of the film thickness of the nonporous layer (several tens of Å) by etching was practicably negligible.

Consequently, the 200 μm-thick porous Si substrate was removed, and a monocrystalline Si layer of 0.5 μm thick was formed on the silicon substrate.

This substrate was heat-treated at 950° C. in a hydrogen atmosphere at 80 Torr. The treated sample was evaluated for surface flatness by interatomic microscope observation. The surface roughness before the hydrogen treatment of 20 nm was improved to 1.7 nm.

The resulting Si layer was found to have no crystal defect newly introduced and have satisfactory crystallinity by observation of cross-section by transmission electron microscopy.

EXAMPLE 22

On the surface of a P-type (100) Si substrate of 200 μm thick, an N-type Si layer of 1 μm thick was formed by proton ion implantation with an $H^+$ implantation quantity of $5\times10^{15}$ (ions/cm²). This substrate was anodized in 50% HF solution at a current density of 100 mA/cm². The porous structure was formed at a rate of 8.4 μm/min. The entire of the P-type (100) Si substrate of 200 μm thick was made porous in 24 minutes. In the anodization, the P-type (100) Si substrate only was made porous with the N-type Si layer remained intact.

The surface of the N-type monocrystal layer was thermally oxidized to a depth of 50 nm. On the thermally oxidation film, a fused silica substrate having been optically polished was superposed and the combined substrates were heated in an oxygen atmosphere at 800° C. for 0.5 hour, whereby the two substrates were bonded tightly.

The bonded two substrates were covered by deposition of $Si_3N_4$ in a thickness of 0.1 μm by low-pressure CVD. Then the nitride film on the porous substrate only was removed by reactive ion etching.

Then the bonded substrates were selectively etched by immersion in a mixture of buffered hydrofluoric acid, alcohol, and aqueous hydrogen peroxide solution (10:6:50) without stirring. In 204 minutes, the porous Si substrate was selectively etched and removed completely with the monocrystalline Si layer left unetched as an etch-stop material.

The rate of etching of the nonporous Si layer by the etching solution is as low as about 40 Å or a little less for 204 minutes. Therefore, the relative rate of selective etching of the porous layer to that of nonporous layer is $10^5$ or more, and the decrease of the film thickness of the nonporous layer (several tens of Å) by etching was practicably negligible.

Consequently, the porous Si substrate of 200 μm was removed, and after removal of the $Si_3N_4$ layer, monocrystalline Si layer of 1.0 μm thick was formed uniformly with no defect on the silicon oxide surface of the silicon substrate.

In the case where the $Si_3N_4$ layer was replaced by Apiezon Wax coating or Electron Wax coating, the effect was the same, and the porous Si substrate only was completely removed.

This Si substrate was heat-treated at 950° C. in a hydrogen atmosphere at 80 Torr. The treated sample was evaluated for surface flatness by interatomic microscope observation. The surface roughness before the hydrogen treatment of 20 nm was improved to 1.7 nm.

The resulting Si layer was found to have no crystal defect newly introduced and have satisfactory crystallinity by observation of cross-section by transmission electron microscopy.

EXAMPLE 23

A monocrystalline P-type (100) Si substrate of 200 μm thick was anodized in 50% HF solution at a current density of 5 mA/cm². The porous structure was formed at a rate of 0.9 μm/min. The entire of the P-type (100) Si substrate of 200 μm thick was made porous in 223 minutes.

The resulting porous Si substrate was heat-treated in a hydrogen atmosphere under the conditions below to obtain a smooth layer on the surface:

Temperature: 950° C.

Pressure: 80 Torr

Time: 25 minutes

The smooth layer on the surface was observed by high-resolution scanning microscopy, RHEED, and it was found that a thin monocrystal layer of 20 nm thick of the same orientation as that of the substrate.

On the surface of this thin monocrystal layer, another Si substrate was superposed which has an oxide layer of 5000

Å thick, and the combined substrates were heated in an oxygen atmosphere at 800° C. for 0.5 hour, thereby the two substrates being bonded tightly.

The bonded two substrates were covered by deposition of $Si_3N_4$ in a thickness of 0.1 μm by low pressure CVD. Then the nitride film on the porous substrate only was removed by reactive ion etching.

The bonded substrates were selectively etched by immersion in a mixture of buffered hydrofluoric acid, alcohol, and aqueous hydrogen peroxide solution (10:6:50) without stirring. In 205 minutes, the porous Si substrate only was selectively etched and removed completely with the monocrystalline Si layer left unetched as an etch-stop material.

After removal of the $Si_3N_4$ layer, a thin monocrystalline Si layer was formed on the $SiO_2$.

The resulting Si layer was confirmed to have no crystal defect newly introduced and have satisfactory crystallinity by observation of cross-section by transmission electron microscopy.

EXAMPLE 24

A monocrystalline P-type (100) Si substrate of 200 μm thick was anodized in 50% HF solution at a current density of 100 mA/cm². The porous structure was formed at a rate of 8.4 μm/min. The entire of the P-type (100) Si substrate of 200 μm thick was made porous in 24 minutes.

The resulting porous Si substrate was heat-treated in a hydrogen atmosphere under the conditions below to obtain a smooth layer on the surface:

Temperature: 950° C.

Pressure: 50 Torr

Time: 45 minutes

The smooth layer on the surface was observed by high-resolution scanning microscopy, RHEED, and it was found that a thin nonporous monocrystal layer of 50 nm thick of the same orientation as that of the substrate.

This epitaxial layer was oxidized in a thickness of 10 nm. On the surface of the oxide layer, another Si substrate was superposed which has an oxide layer of 5000 Å thick, and the combined substrates were heated in an oxygen atmosphere at 900° C. for 0.5 hour, thereby the two substrates being bonded tightly.

The bonded two substrates were covered by deposition of $Si_3N_4$ in a thickness of 0.1 μm by low pressure CVD. Then the nitride film on the porous substrate only was removed by reactive ion etching.

The bonded substrates were etched by immersion in 6M KOH solution. As described before, the etching rate of the ordinary monocrystalline Si by KOH is about 1 μm or less per minute, while the etching rate of the porous Si layer is about 100 times that of the nonporous monocrystalline Si. Therefore, the porous Si substrate of 200 μm thick was removed in 2 minutes. After removal of the $Si_3N_4$, a monocrystalline Si was formed with excellent crystallinity on the $SiO_2$.

EXAMPLE 25

A monocrystalline P-type (100) Si substrate of 200 μm thick was anodized in 50% HF solution at a current density of 100 mA/cm². The porous structure was formed at a rate of 8.4 μm/min. The entire of the P-type (100) Si substrate of 200 μm thick was made porous in 24 minutes.

The resulting porous Si substrate was washed with 1.5% hydrofluoric acid solution, and then immediately heat-treated in an argon atmosphere under the conditions below to obtain a smooth layer on the surface:

Temperature: 950° C.

Pressure: 1 Torr

Time: 60 minutes

The smooth layer on the surface was observed by high-resolution scanning microscopy, RHEED, and it was found that a thin monocrystal layer of 20 nm thick was formed in the same orientation as the substrate.

On the surface of this thin monocrystal layer, another Si substrate was superposed which has an oxide layer of 5000 Å thick, and the combined substrates were heated in an oxygen atmosphere at 800° C. for 0.5 hour, thereby the two substrates being bonded tightly.

The bonded two substrates were covered by deposition of $Si_3N_4$ in a thickness of 0.1 μm by low pressure CVD. Then the nitride film on the porous substrate only was removed by reactive ion etching.

The bonded substrates were etched by immersion in a hydrofluoric nitric acetic acid solution (1:3:8). As described above, the etching rate of the ordinary monocrystalline Si by the hydrofluoric nitric acetic acid is about 1 μm or less per minute, while the etching rate of the porous Si layer is about 100 times that of the nonporous monocrystalline Si. Therefore, the porous Si substrate of 200 μm thick was removed in 2 minutes. After removal of the $Si_3N_4$, a monocrystalline Si layer was formed on the $SiO_2$.

The same effect of selective and complete removal of the porous Si substrate could be obtained when Apiezon Wax was used for the covering in place of the $Si_3N_4$ layer.

EXAMPLE 26

A monocrystalline P-type (100) Si substrate of 300 μm thick was anodized in 50% HF solution at a current density of 5 mA/cm². The porous structure was formed at a rate of 0.9 μm/min. The surface of the P-type (100) Si substrate of 300 μm thick was made porous to a thickness of 30 μm.

The resulting partly porous Si substrate was heat-treated in a hydrogen atmosphere under the conditions below to obtain a smooth layer on the surface:

Temperature: 950° C.

Pressure: 60 Torr

Time: 25 minutes

The smooth layer on the surface was observed by high-resolution scanning microscopy, RHEED, and it was found that a thin monocrystal layer of 30 nm thick was formed in the same orientation as that of the substrate.

This monocrystalline layer was oxidized to a thickness of 100 Å. Onto the surface of the oxide layer, another Si substrate was attached closely which has an oxide layer of 5000 Å thick, and the combined substrates were heated in an oxygen atmosphere at 700° C. for 0.5 hour, thereby the two substrates being bonded tightly.

The partly porous Si substrate was abraded from the nonporous side to remove 275 μm thereof by a usual wafer lapping method to uncover the porous silicon.

The substrates were covered by deposition of $Si_3N_4$ in a thickness of 0.1 μm by low pressure CVD. Then the nitride film on the porous substrate only was removed by reactive ion etching.

The bonded substrates were selectively etched by immersion in a mixture of buffered hydrofluoric acid, alcohol, and aqueous hydrogen peroxide solution (10:6:50) without stirring. In 30 minutes, the porous Si substrate only was selectively etched and removed completely with the monocrystalline Si layer left unetched as an etch-stop material. After removal of the $Si_3N_4$ layer, a monocrystalline Si layer was formed on the $SiO_2$.

The same-effect of selective and complete removal of the porous Si substrate could be obtained when Apiezon Wax was used for the covering in place of the $Si_3N_4$ layer.

EXAMPLE 27

A monocrystalline P-type (100) Si substrate of 200 μm thick was anodized in 50% HF solution at a current density of 100 mA/cm². The porous structure was formed at a rate of 8.4 μm/min. The entire of the P-type (100) Si substrate of 200 μm thick was made porous in 24 minutes.

The resulting porous Si substrate was heat-treated in a hydrogen atmosphere under the conditions below to obtain a smooth layer on the surface:

Temperature: 950° C.

Pressure: 760 Torr

Time: 80 minutes

The smooth layer on the surface was observed by high-resolution scanning microscopy, RHEED, and it was found that a thin monocrystal layer of 20 nm thick was formed in the same orientation as that of the substrate.

On the surface of this thin monocrystal layer, another Si substrate was attached closely which has an oxide layer of 5000 Å thick, and the combined substrates were heated in an oxygen atmosphere at 700° C. for 0.5 hour, thereby the two substrates being bonded tightly.

The bonded two substrates were covered by deposition of $Si_3N_4$ in a thickness of 0.1 μm by low pressure CVD. Then the nitride film on the porous substrate only was removed by reactive ion etching.

The bonded substrates were etched by immersion in a hydrofluoric nitric acetic acid solution (1:3:8). As described above, the etching rate of the ordinary monocrystalline Si by the hydrofluoric nitric acetic acid is about 1 μm or less per minute, while the etching rate of the porous Si layer is about 100 times that of the nonporous monocrystalline Si. Therefore, the porous Si substrate of 200 μm thick was removed in 2 minutes. After removal of the $Si_3N_4$, a monocrystalline Si layer was formed on the $SiO_2$.

Subsequently, a monocrystalline Si layer was epitaxially grown in a thickness of 2 μm from the thin monocrystal layer by ordinary CVD. The growth conditions are as below.

Gas: $SiH_2Cl_2/H_2$ ½₈₀ (l/min)

Temperature: 1080° C.

Pressure: 80 Torr

As the result, a monocrystalline Si layer of 2 μm thick was formed on the $SiO_2$.

EXAMPLE 28

A monocrystalline P-type (100) Si substrate of 200 μm thick was anodized in 50% HF solution at a current density of 100 mA/cm². The porous structure was formed at a rate of 8.4 μm/min. The entire of the P-type (100) Si substrate of 200 μm thick was made porous in 24 minutes.

The resulting porous Si substrate was washed with 1.5% hydrofluoric acid solution, and then immediately heat-treated in a vacuum chamber under the conditions below to obtain a smooth layer on the surface:

Temperature: 950° C.

Pressure: $1 \times 10^{-8}$ Torr

Time: 100 minutes

The smooth layer on the surface was observed by high-resolution scanning microscopy, RHEED, and it was found that a thin monocrystal layer of 15 nm thick was formed in the same orientation as that of the substrate.

On the surface of this thin monocrystal layer, another Si substrate was superposed which has an oxide layer of 5000 Å thick, and the combined substrates were heated in an oxygen atmosphere at 800° C. for 0.5 hour, thereby the two substrates being bonded tightly.

The bonded two substrates were covered by deposition of $Si_3N_4$ in a thickness of 0.1 μm by low pressure CVD. Then the nitride film on the porous substrate only was removed by reactive ion etching.

The bonded substrates were selectively etched by immersion in a mixture of buffered hydrofluoric acid, alcohol, and aqueous hydrogen peroxide solution (10:6:50) without stirring. In 205 minutes, the porous Si substrate only was selectively etched and removed completely with the monocrystalline Si layer left unetched as an etch-stop material. After removal of the $Si_3N_4$ layer, a thin monocrystalline Si layer was formed on the $SiO_2$.

The resulting Si layer was confirmed to have no crystal defect newly introduced and keep satisfactory crystallinity by observation of cross-section by transmission electron microscopy.

EXAMPLE 29

A monocrystalline P-type (100) Si substrate of 200 μm thick was anodized in 50% HF solution at a current density of 5 mA/cm². The porous structure was formed at a rate of 0.9 μm/min. The entire of the P-type (100) Si substrate of 200 μm thick was made porous in 223 minutes.

The resulting porous Si substrate was heat-treated in a hydrogen atmosphere under the conditions below to obtain a smooth layer on the surface:

Temperature: 950° C.

Pressure: 80 Torr

Time: 25 minutes

The smooth layer on the surface was observed by high-resolution scanning microscopy, RHEED, and it was found that a thin monocrystal layer of 20 nm thick of the same orientation as that of the substrate.

On the surface of this thin monocrystal layer, an optically polished fused silica substrate was superposed, and the combined substrates were heated in an oxygen atmosphere at 800° C. for 0.5 hour, thereby the two substrates being bonded tightly.

The bonded two substrates were covered by deposition of $Si_3N_4$ in a thickness of 0.1 μm by low pressure CVD. Then the nitride film on the porous substrate only was removed by reactive ion etching.

The bonded substrates were selectively etched by immersion in a mixture of 49% hydrofluoric acid, alcohol, and aqueous hydrogen peroxide solution (10:6:50) without stirring. In 65 minutes, the porous Si layer only was selectively etched and removed completely with the monocrystalline Si layer left unetched as an etch-stop material. After removal of the $Si_3N_4$ layer, a thin monocrystalline Si layer was formed on the fused silica substrate.

The resulting Si layer was confirmed to have no crystal defect newly introduced and keep satisfactory crystallinity by observation of cross-section by transmission electron microscopy.

EXAMPLE 30

A monocrystalline P-type (100) Si substrate of 200 μm thick was anodized in 50% HF solution at a current density of 100 mA/Cm². The porous structure was formed at a rate of 8.4 μm/min. The entire of the P-type (100) Si substrate of 200 μm thick was made porous in 24 minutes.

The resulting porous Si substrate was heat-treated in a hydrogen atmosphere under the conditions below to obtain a smooth layer on the surface:

Temperature: 950° C.

Pressure: 50 Torr

Time: 45 minutes

The smooth layer on the surface was observed by high-resolution scanning microscopy, RHEED, and it was found that a thin nonporous monocrystal layer of 50 nm thick of the same orientation as that of the substrate.

This epitaxial layer was oxidized to a thickness of 10 nm. On the surface of the oxide layer, an optically polished glass substrate having the softening point of about 500° C. was superposed, and the combined substrates were heated in an oxygen atmosphere at 450° C. for 0.5 hour, thereby the two substrates being bonded tightly.

The bonded two substrates were covered by deposition of $Si_3N_4$ in a thickness of 0.1 μm by low pressure CVD. Then the nitride film on the porous substrate only was removed by reactive ion etching.

The bonded substrates were etched by immersion in 6M KOH solution. As described before, the etching rate of the ordinary monocrystalline Si by KOH is about 1 μm or less per minute, while the etching rate of the porous Si layer is about 100 times that of the nonporous monocrystalline Si. Therefore, the porous Si substrate of 200 μm thick was removed in 2 minutes. After removal of the $Si_3N_4$, a monocrystalline Si was formed with excellent crystallinity on the low-softening-point glass substrate.

EXAMPLE 31

A monocrystalline P-type (100) Si substrate of 200 μm thick was anodized in 50% HF solution at a current density of 100 mA/cm². The porous structure was formed at a rate of 8.4 μm/min. The entire of the P-type (100) Si substrate of 200 μm thick was made porous in 24 minutes.

The resulting porous Si substrate was washed with 1.5% hydrofluoric acid solution, and then immediately heat-treated in an argon atmosphere under the conditions below to obtain a smooth layer on the surface:

Temperature: 950° C.

Pressure: 1 Torr

Time: 60 minutes

The smooth layer on the surface was observed by high-resolution scanning microscopy, RHEED, and it was found that a thin monocrystal layer of 20 nm thick was formed in the same orientation as that of the substrate.

On the surface of this thin monocrystal layer, an optically polished glass substrate having the softening point of about 500° C. was superposed, and the combined substrates were heated in an oxygen atmosphere at 450° C. for 0.5 hour, thereby the two substrates being bonded tightly.

The bonded two substrates were covered by deposition of $Si_3N_4$ in a thickness of 0.1 μm by low pressure CVD. Then the nitride film on the porous substrate only was removed by reactive ion etching.

The bonded substrates were etched by immersion in a hydrofluoric nitric acetic acid solution (1:3:8). As described above, the etching rate of the ordinary monocrystalline Si by the hydrofluoric nitric acetic acid is about 1 μm or less per minute, while the etching rate of the porous Si layer is about 100 times that of the nonporous monocrystalline Si. Therefore, the porous Si substrate of 200 μm thick was removed in 2 minutes. After removal of the $Si_3N_4$ layer, a monocrystalline Si layer was formed on the low-softening point glass substrate.

The same effect of selective and complete removal of the porous Si substrate could be obtained when Apiezon Wax was used for the covering in place of the $Si_3N_4$ layer.

EXAMPLE 32

A monocrystalline P-type (100) Si substrate of 300 μm thick was anodized in 50% HF solution at a current density of 5 mA/cm². The porous structure was formed at a rate of 0.9 μm/min. The surface of the P-type (100) Si substrate of 300 μm thick was made porous to a thickness of 30 μm.

The resulting partly porous Si substrate was heat-treated in a hydrogen atmosphere under the conditions below to obtain a smooth layer on the surface:

Temperature: 950° C.

Pressure: 60 Torr

Time: 25 minutes

The smooth layer on the surface was observed by high-resolution scanning microscopy, RHEED, and it was found that a thin monocrystal layer of 30 nm thick was formed in the same orientation as that of the substrate.

This monocrystalline layer was oxidized to a thickness of 100 Å. Onto the surface of the oxide layer, a fused silica substrate was attached closely, and the attached substrates were heated in an oxygen atmosphere at 700° C. for 0.5 hour, thereby the two substrates being bonded tightly.

The partly porous Si substrate was abraded from the nonporous side to remove 270 μm thereof by a usual wafer lapping method to uncover the porous silicon.

The substrates were covered by deposition of $Si_3N_4$ in a thickness of 0.1 μm by low pressure CVD. Then the nitride film on the porous substrate only was removed by reactive ion etching.

The bonded substrates were selectively etched by immersion in a mixture of buffered hydrofluoric acid, alcohol, and aqueous hydrogen peroxide solution (10:6:50) without stirring. In 30 minutes, the porous Si substrate only was selectively etched and removed completely with the monocrystalline Si layer left unetched as an etch-stop material. After removal of the $Si_3N_4$ layer, a monocrystalline Si layer was formed on the fused silica substrate.

The same effect of selective and complete removal of the porous Si substrate could be obtained when Apiezon Wax was used for the covering in place of the $Si_3N_4$ layer.

EXAMPLE 33

A monocrystalline P-type (100) Si substrate of 200 μm thick was anodized in 50% HF solution at a current density of 100 mA/cm². The porous structure was formed at a rate of 8.4 μm/min. The entire of the P-type (100) Si substrate of 200 μm thick was made porous in 24 minutes.

The resulting porous Si substrate was heat-treated in a hydrogen atmosphere under the conditions below to obtain a smooth layer on the surface:

Temperature: 950° C.

Pressure: 760 Torr

Time: 80 minutes

The smooth layer on the surface was observed by high-resolution scanning microscopy, RHEED, and it was found that a thin monocrystal layer of 20 nm thick was formed in the same orientation as that of the substrate.

On the surface of this thin monocrystal layer, an optically polished glass substrate having the softening point of about 800° C. was attached closely, and the attached substrates were heated at 700° C. for 0.5 hour, thereby the two substrates being bonded tightly.

The bonded two substrates were covered by deposition of $Si_3N_4$ in a thickness of 0.1 µm by low pressure CVD. Then the nitride film on the porous substrate only was removed by reactive ion etching.

The bonded substrates were etched by immersion in a hydrofluoric nitric acetic acid solution (1:3:8). As described above, the etching rate of the ordinary monocrystalline Si by the hydrofluoric nitric acetic acid is about 1 µm or less per minute, while the etching rate of the porous Si layer is about 100 times that of the nonporous monocrystalline Si. Therefore, the porous Si substrate of 200 µm thick was removed in 2 minutes. After removal of the $Si_3N_4$, a monocrystalline Si layer was formed on the glass substrate.

Subsequently, a monocrystalline Si layer was epitaxially grown in a thickness of 2 µm from the thin monocrystal layer by ordinary CVD. The growth conditions are as below.

Gas: $SiH_2Cl_2/H_2$ ½₁₈₀ (l/min)

Temperature: 1080° C.

Pressure: 80 Torr

As the result, a monocrystalline Si layer of 2 µm thick was formed on the glass substrate.

EXAMPLE 34

A monocrystalline P-type (100) Si substrate of 200 µm thick was anodized in 50% HF solution at a current density of 100 mA/cm². The porous structure was formed at a rate of 8.4 µm/min. The entire of the P-type (100) Si substrate of 200 µm thick was made porous in 24 minutes.

The resulting porous Si substrate was washed with 1.5% hydrofluoric acid solution, and then immediately heat-treated in a vacuum chamber under the conditions below to obtain a smooth layer on the surface:

Temperature: 950° C.

Pressure: $1 \times 10^{-8}$ Torr

Time: 100 minutes

The smooth layer on the surface was observed by high-resolution scanning microscopy, RHEED, and it was found that a thin monocrystal layer of 15 nm thick was formed in the same orientation as that of the substrate.

On the surface of this thin monocrystal layer, an optically polished fused silica substrate was superposed, and the combined substrates were heated in an oxygen atmosphere at 800° C. for 0.5 hour, thereby the two substrates being bonded tightly.

The bonded two substrates were covered by deposition of $Si_3N_4$ in a thickness of 0.1 µm by low pressure CVD. Then the nitride film on the porous substrate only was removed by reactive ion etching.

The bonded substrates were selectively etched by immersion in a mixture of buffered hydrofluoric acid, alcohol, and aqueous hydrogen peroxide solution (10:6:50) without stirring. In 205 minutes, the porous Si substrate only was selectively etched and removed completely with the monocrystalline Si layer left unetched as an etch-stop material. After removal of the $Si_3N_4$ layer, a thin monocrystalline Si layer was formed on the fused silica substrate.

The resulting Si layer was confirmed to have no crystal defect newly introduced and keep satisfactory crystallinity by observation of cross-section by transmission electron microscopy.

The same effect of selective and complete removal of the porous Si substrate could be obtained when Apiezon Wax was used for the covering in place of the $Si_3N_4$ layer.

As described in detail above, the present invention provides an excellent process for producing on an insulating substrate a crystalline Si layer having high crystallinity corresponding to monocrystalline wafer, which is superior in productivity, uniformity, controllability, and cost.

The present invention provides a process for producing a semiconductor substrate which has the advantages of conventional SOI devices and is applicable to various high-performance electronic devices, integrated circuits and the like.

The present invention provides a process for producing a semiconductor substrate which can replace the expensive SOS and SIMOX in production of large-scale integrated circuits of SOI structure.

What is claimed is:

1. A process for producing a semiconductor substrate comprising: (a) providing a substrate having a non-porous monocrystalline semiconductor layer epitaxially grown on a porous monocrystalline semiconductor; and (b) heat-treating the substrate at a temperature lower than the melting point of the non-porous monocrystalline semiconductor layer in a hydrogen atmosphere or a reducing atmosphere comprising hydrogen to flatten a surface of the non-porous monocrystalline semiconductor layer.

2. The process according to claim 1, wherein the heat treatment reduces the difference in height of the surface to 2 nm or less.

3. The process according to claim 1, wherein the heat treatment is carried out at a pressure not higher than atmospheric pressure.

4. The process according to claim 3, wherein the heat treatment is carried out at a pressure not higher than 200 Torr.

5. The process according to claim 1, wherein the heat treatment is carried out at a temperature of 300° C. or higher.

6. The process according to claim 5, wherein the heat treatment is carried out at a temperature of 500° C. or higher.

7. The process according to claim 1, wherein the heat treatment is carried out at a temperature of 1200° C. or lower.

8. The process according to claim 1, wherein the porous monocrystalline semiconductor layer and the non-porous monocrystalline semiconductor layer each comprise silicon.

9. A process for producing a semiconductor substrate comprising the steps of:

providing a first substrate having a porous monocrystalline semiconductor layer and a non-porous monocrystalline semiconductor layer;

heat-treating the first substrate at a temperature lower than the melting point of the non-porous monocrystalline semiconductor layer in a hydrogen atmosphere or a reducing atmosphere comprising hydrogen;

then bonding the first substrate to a second substrate with an insulating layer therebetween to obtain a multi-layer structure member such that the non-porous monocrystalline semiconductor layer is positioned inside of the multi-layer structure member; and removing the porous monocrystalline semiconductor layer from the multi-layer structure member.

10. The process according to claim 9, wherein the second substrate comprises silicon.

11. The process according to claim 9, wherein the second substrate and the insulating layer are formed by oxidizing a surface of a silicon substrate.

12. The process according to claim 9, wherein the first substrate and the insulating layer are formed by oxidizing a surface of a non-porous monocrystalline semiconductor layer of a substrate having a porous monocrystalline semiconductor layer and the non-porous monocrystalline semiconductor layer.

13. The process according to claim 9, wherein the insulating layer comprises a first insulating layer and a second insulating layer, wherein the first substrate and the first insulating layer are formed by oxidizing a surface of a non-porous monocrystalline semiconductor layer of a substrate having a porous monocrystalline semiconductor layer and the non-porous monocrystalline semiconductor layer, and wherein the second substrate and the second insulating layer are formed by oxidizing a surface of a silicon substrate.

14. A process for producing a semiconductor substrate comprising the steps of:
   providing a first substrate having a porous monocrystalline semiconductor layer and a non-porous monocrystalline semiconductor layer;
   heat-treating the first substrate at a temperature lower than the melting point of the non-porous monocrystalline semiconductor layer in a hydrogen atmosphere or a reducing atmosphere comprising hydrogen;
   then bonding the first substrate to a light transmitting second substrate to obtain a multi-layer structure member such that the non-porous monocrystalline semiconductor layer is positioned inside of the multi-layer structure member; and
   removing the porous monocrystalline semiconductor layer from the multi-layer structure member.

15. The process according to claim 14, wherein the second substrate comprises quartz.

16. The process according to claim 14, wherein the second substrate comprises glass.

17. The process according to claim 9 or 14, wherein the porous monocrystalline semiconductor layer and the non-porous monocrystalline semiconductor layer each comprise silicon.

18. The process according to claim 9 or 14, wherein the non-porous monocrystalline semiconductor layer has a thickness of 50 $\mu$m or less.

19. The process according to claim 9 or 14, wherein the step of bonding comprises heat treatment in oxygen atmosphere or nitrogen atmosphere.

20. The process according to claim 9 or 14, wherein the non-porous monocrystalline semiconductor layer is formed by epitaxial growth on the porous monocrystalline semiconductor layer.

21. The process according to claim 20, wherein the non-porous monocrystalline semiconductor layer is formed by a method selected from molecular beam epitaxy, plasma chemical vapor deposition, thermal chemical vapor deposition, photo chemical vapor deposition, bias sputtering, and liquid phase growth.

22. The process according to claim 9 or 14, wherein the porous monocrystalline semiconductor layer of the first substrate is formed by porousifying at least a part of a substrate comprising non-porous monocrystalline semiconductor.

23. The process according to claim 22, wherein the porous monocrystalline semiconductor layer of the first substrate is formed by partly porousifying a substrate comprising non-porous monocrystalline semiconductor and after the bonding step and before the removal of the porous monocrystalline semiconductor layer, removing a region remaining non-porous of the first substrate.

24. The process according to claim 23, wherein the region remaining non-porous of the first substrate is removed by polishing or grinding.

25. The process according to claim 22, wherein the first substrate is formed by providing a silicon substrate having one side surface of n-type and the other side surface of p-type and by porousifying the p-type surface region of the silicon substrate.

26. The process according to claim 22, wherein the porousification is carried out by anodization.

27. The process according to claim 9 or 14, wherein prior to the heat treatment of the first substrate, a surface of the non-porous monocrystalline semiconductor layer is cleaned with hydrofluoric acid.

28. The process according to claim 9 or 14, further comprising after the removal of the porous monocrystalline semiconductor layer, epitaxially growing a monocrystalline semiconductor layer on the non-porous monocrystalline semiconductor layer on the second substrate.

29. The process according to claim 9 or 14, the removal of the porous monocrystalline semiconductor layer is carried out by etching.

30. The process according to claim 29, wherein the etching is carried out using an aqueous solution containing hydrofluoric acid as an etchant.

31. The process according to claim 9 or 14, wherein the heat treatment reduces the difference in height of the surface to 2 nm or less.

32. The process according to claim 9 or 14, wherein the heat treatment is carried out at a pressure not higher than atmospheric pressure.

33. The process according to claim 32, wherein the heat treatment is carried out at a pressure not higher than 200 Torr.

34. The process according to claim 9 or 14, wherein the heat treatment is carried out at a temperature of 300° C. or higher.

35. The process according to claim 34, wherein the heat treatment is carried out at a temperature of 500° C. or higher.

36. The process according to claim 9 or 14, wherein the heat treatment is carried out at a temperature of 1200° C. or lower.

37. A process for producing a semiconductor substrate comprising the steps of:
   providing a first substrate having a porous monocrystalline semiconductor layer and a non-porous monocrystalline semiconductor layer;
   bonding the first substrate to a second substrate with an insulating layer therebetween to obtain a multi-layer structure member such that the non-porous monocrystalline semiconductor layer is positioned inside of the multi-layer structure member;
   removing the porous monocrystalline semiconductor layer from the multi-layer structure member; and
   then heat-treating the non-porous monocrystalline semiconductor layer on the second substrate with the insulating layer therebetween at a temperature lower than the melting point of the non-porous monocrystalline semiconductor layer in a hydrogen atmosphere or a reducing atmosphere comprising hydrogen.

38. The process according to claim 37, wherein the second substrate comprises silicon.

39. The process according to claim 37, wherein the second substrate and the insulating layer are formed by oxidizing a surface of a silicon substrate.

40. The process according to claim 37, wherein the first substrate and the insulating layer are formed by oxidizing a surface of a non-porous monocrystalline semiconductor layer of a substrate having a porous monocrystalline semiconductor layer and the non-porous monocrystalline semiconductor layer.

41. The process according to claim 37, wherein the insulating layer comprises a first insulating layer and a second insulating layer, wherein the first substrate and the first insulating layer are formed by oxidizing a surface of a non-porous monocrystalline semiconductor layer of a substrate having a porous monocrystalline semiconductor layer and the non-porous monocrystalline semiconductor layer, and wherein the second substrate and the second insulating layer are formed by oxidizing a surface of a silicon substrate.

42. A process for producing a semiconductor substrate comprising the steps of:

providing a first substrate having a porous monocrystalline semiconductor layer and a non-porous monocrystalline semiconductor layer;

bonding the first substrate to a light transmitting second substrate to obtain a multi-layer structure member such that the non-porous monocrystalline semiconductor layer is positioned inside of the multi-layer structure member;

removing the porous monocrystalline semiconductor layer from the multi-layer structure member; and then heat-treating the non-porous monocrystalline semiconductor layer on the light-transmitting second substrate at a temperature lower than the melting point of the non-porous monocrystalline semiconductor layer in a hydrogen atmosphere or a reducing atmosphere comprising hydrogen.

43. The process according to claim 42, wherein the second substrate comprises quartz.

44. The process according to claim 42, wherein the second substrate comprises glass.

45. The process according to claim 32 or 42, wherein the heat treatment reduces the difference in height of the surface to 2 nm or less.

46. The process according to claim 42, wherein the heat treatment is carried out at a pressure not higher than atmospheric pressure.

47. The process according to claim 42, wherein the heat treatment is carried out at a pressure not higher than 200 Torr.

48. The process according to claim 42, wherein the heat treatment is carried out at a temperature of 300° C. or higher.

49. The process according to claim 42, wherein the heat treatment is carried out at a temperature of 500° C. or higher.

50. The process according to claim 42, wherein the heat treatment is carried out at a temperature of 1200° C. or lower.

51. The process according to claim 37 or 42, wherein the porous monocrystalline semiconductor layer and the non-porous monocrystalline semiconductor layer each comprise silicon.

52. The process according to claim 37 or 42, wherein the non-porous monocrystalline semiconductor layer has a thickness of 50 μm or less.

53. The process according to claim 37 or 42, wherein the step of bonding comprises heat treatment in oxygen atmosphere or nitrogen atmosphere.

54. The process according to claim 37 or 42, wherein the non-porous monocrystalline semiconductor layer is formed by epitaxial growth on the porous monocrystalline semiconductor layer.

55. The process according to claim 54, wherein the non-porous monocrystalline semiconductor layer is formed by a method selected from molecular beam epitaxy, plasma chemical vapor deposition, thermal chemical vapor deposition, photo chemical vapor deposition, bias sputtering, and liquid phase growth.

56. The process according to claim 37 or 42, wherein the porous monocrystalline semiconductor layer of the first substrate is formed by porousifying at least a part of a substrate comprising non-porous monocrystalline semiconductor.

57. The process according to claim 56, wherein the porous monocrystalline semiconductor layer of the first substrate is formed by partly porousifying a substrate comprising non-porous monocrystalline semiconductor and after the bonding step and before the removal of the porous monocrystalline semiconductor layer, removing a region remaining non-porous of the first substrate.

58. The process according to claim 57, wherein the region remaining non-porous of the first substrate is removed by polishing or grinding.

59. The process according to claim 56, wherein the first substrate is formed by providing a silicon substrate having one side surface of n-type and the other side surface of p-type and by porousifying the p-type surface region of the silicon substrate.

60. The process according to claim 56, wherein the porousification is carried out by anodization.

61. The process according to claim 37 or 42, wherein prior to the heat treatment of the first substrate, a surface of the non-porous monocrystalline semiconductor layer is cleaned with hydrofluoric acid.

62. The process according to claim 37 or 42, further comprising after the removal of the porous monocrystalline semiconductor layer, epitaxially growing a monocrystalline semiconductor layer on the non-porous monocrystalline semiconductor layer on the second substrate.

63. The process according to claim 37 or 42, the removal of the porous monocrystalline semiconductor layer is carried out by etching.

64. The process according to claim 63, wherein the etching is carried out using an aqueous solution containing hydrofluoric acid as an etchant.

65. A process for producing a semiconductor substrate comprising the steps of:

heat-treating a first substrate having a porous monocrystalline semiconductor layer at a temperature lower than the melting point of the porous monocrystalline semiconductor layer in a hydrogen atmosphere or a reducing atmosphere comprising hydrogen to form a non-porous monocrystalline semiconductor layer on a surface of the porous monocrystalline semiconductor layer;

then bonding the first substrate to a second substrate with an insulating layer therebetween to obtain a multi-layer structure member such that the non-porous monocrystalline semiconductor layer is positioned inside of the multi-layer structure member; and removing the porous monocrystalline semiconductor layer from the multi-layer structure member.

66. The process according to claim 65, wherein the heat treatment of the first substrate is carried out at a pressure not higher than the atmospheric pressure.

67. The process according to claim 66, wherein the heat treatment of the first substrate is carried out at a pressure not higher than 200 Torr.

68. The process according to claim 65, wherein the heat treatment of the first substrate is carried out at a temperature of 300° C. or higher.

69. The process according to claim 68, wherein the heat treatment of the first substrate is carried out at a temperature of 500° C. or higher.

70. The process according to claim 65, wherein the porous monocrystalline semiconductor layer comprises silicon.

71. The process according to claim 70, wherein the porous monocrystalline semiconductor layer comprises p-type silicon.

72. The process according to claim 65, wherein the porous monocrystalline semiconductor layer is formed by porousifying at least a part of a first substrate comprising non-porous monocrystalline semiconductor.

73. The process according to claim 72, wherein the porous monocrystalline semiconductor layer is formed by partly porousifying a first substrate comprising non-porous monocrystalline semiconductor and after the bonding step and before the removal of the porous monocrystalline semiconductor layer, removing a region remaining non-porous of the first substrate.

74. The process according to claim 73, wherein the region remaining non-porous of the first substrate is removed by polishing or grinding.

75. The process according to claim 65, wherein the porousification is carried out by anodization.

76. The process according to claim 65, wherein prior to the heat treatment of the first substrate, a surface of the porous monocrystalline semiconductor layer is cleaned with hydrofluoric acid.

77. The process according to claim 65, further comprising after the removal of the porous monocrystalline semiconductor layer, epitaxially growing a monocrystalline semiconductor layer on the non-porous monocrystalline semiconductor layer on the second substrate.

78. The process according to claim 65, wherein the second substrate comprises silicon.

79. The process according to claim 65, wherein the second substrate and the oxide layer are formed by oxidizing a surface of a silicon substrate.

80. The process according to claim 65, wherein the first substrate and the oxide layer are formed by oxidizing a surface of a non-porous monocrystalline semiconductor layer of a substrate having the non-porous monocrystalline semiconductor layer formed on a surface of a porous monocrystalline semiconductor layer.

81. The process according to claim 65, wherein the oxide layer comprises a first oxide layer and a second oxide layer, wherein the first substrate and the first oxide layer are formed by oxidizing a surface of a non-porous monocrystalline semiconductor layer of a substrate having the non-porous monocrystalline semiconductor layer formed on a surface of a porous monocrystalline semiconductor layer, and wherein the second substrate and the second oxide layer are formed by oxidizing a surface of a silicon substrate.

82. The process according to claim 65, the removal of the porous monocrystalline semiconductor layer is carried out by etching.

83. The process according to claim 82, wherein the etching is carried out using an aqueous solution containing hydrofluoric acid as an etchant.

84. The process according to claim 65, wherein the step of bonding comprises heat treatment in oxygen atmosphere or nitrogen atmosphere.

85. A process for producing a semiconductor substrate comprising the steps of:
heat-treating a first substrate having a porous monocrystalline semiconductor layer at a temperature lower than the melting point of the porous monocrystalline semiconductor layer in a hydrogen atmosphere or a reducing atmosphere comprising hydrogen to form a non-porous monocrystalline semiconductor layer on a surface of the porous monocrystalline semiconductor layer;
then bonding the first substrate to a light transmitting second substrate to obtain a multi-layer structure member such that the non-porous monocrystalline semiconductor layer is positioned inside of the multi-layer structure member; and
removing the porous monocrystalline semiconductor layer from the multi-layer structure member.

86. The process according to claim 85, wherein the heat treatment of the first substrate is carried out at a pressure not higher than atmospheric pressure.

87. The process according to claim 86, wherein the heat treatment of the first substrate is carried out at a pressure not higher than 200 Torr.

88. The process according to claim 85, wherein the heat treatment of the first substrate is carried out at a temperature of 300° C. or higher.

89. The process according to claim 88, wherein the heat treatment of the first substrate is carried out at a temperature of 500° C. or higher.

90. The process according to claim 85, wherein the porous monocrystalline semiconductor layer comprises silicon.

91. The process according to claim 90, wherein the porous monocrystalline semiconductor layer comprises p-type silicon.

92. The process according to claim 85, wherein the porous monocrystalline semiconductor layer is formed by porousifying at least a part of a first substrate comprising non-porous monocrystalline semiconductor.

93. The process according to claim 92, wherein the porous monocrystalline semiconductor layer is formed by partly porousifying a first substrate comprising non-porous monocrystalline semiconductor and after the bonding step and before the removal of the porous monocrystalline semiconductor layer, removing a region remaining non-porous of the first substrate.

94. The process according to claim 93, wherein the region remaining non-porous of the first substrate is removed by polishing or grinding.

95. The process according to claim 92, wherein the porousification is carried out by anodization.

96. The process according to claim 85, wherein prior to the heat treatment of the first substrate, a surface of the porous monocrystalline semiconductor layer is cleaned with hydrofluoric acid.

97. The process according to claim 85, further comprising after the removal of the porous monocrystalline semiconductor layer, epitaxially growing a monocrystalline semiconductor layer on the non-porous monocrystalline semiconductor layer on the second substrate.

98. The process according to claim 85, wherein the second substrate comprises glass.

99. The process according to claim 85, wherein the second substrate comprises quartz.

100. The process according to claim 85, wherein prior to the step of bonding, a surface of the non-porous monocrystalline semiconductor layer is oxidized to form an oxide layer.

101. The process according to claim 85, the removal of the porous monocrystalline semiconductor layer is carried out by etching.

102. The process according to claim 101, wherein the etching is carried out using an aqueous solution containing hydrofluoric acid as an etchant.

103. The process according to claim 85, wherein the step of bonding comprises heat treatment in oxygen atmosphere or nitrogen atmosphere.

104. The process according to claim 65 or 85, wherein the heat treatment reduces the difference in height of the surface to 2 nm or less.

105. A process for producing a semiconductor substrate comprising the steps of:
providing a first substrate having a nonporous monocrystalline layer on a support substrate;

bonding the first substrate to a second substrate such that the non-porous monocrystalline layer is positioned inside;

removing the support substrate on the nonporous monocrystalline layer bonded to the second substrate; and then heat-treating the non-porous monocrystalline layer bonded to the second substrate at a temperature lower than the melting point of the non-porous monocrystalline layer in a hydrogen atmosphere or a reducing atmosphere comprising hydrogen to obtain a flattened, exposed surface of the non-porous monocrystalline layer bonded to the second substrate.

106. A process for producing a semiconductor substrate comprising the steps of:

providing a first substrate having a nonporous monocrystalline layer provided on a porous layer on a non-porous monocrystalline region;

bonding the first substrate to a second substrate such that the non-porous monocrystalline layer is positioned inside;

removing the porous layer and the non-porous monocrystalline region on the non-porous monocrystalline layer bonded to the second substrate; and then heat-treating the non-porous monocrystalline layer bonded to the second substrate at a temperature lower than the melting point of the non-porous monocrystalline layer in a hydrogen atmosphere or a reducing atmosphere comprising hydrogen;

whereby a flattened, exposed surface of the non-porous monocrystalline layer bonded to the second substrate is obtained.

107. The process according to claim 106, wherein the step of bonding is carried out with an insulating layer formed on a surface of the non-porous monocrystalline layer therebetween.

108. The process according to claim 106, wherein the exposed surface is an unpolished surface.

109. A process for producing a semiconductor substrate comprising: (a) providing a substrate having a non-porous monocrystalline semiconductor layer epitaxially grown on a porous monocrystalline semiconductor; and (b) heat-treating the substrate at a temperature lower than the melting point of the non-porous monocrystalline semiconductor layer in a hydrogen atmosphere or a reducing atmosphere comprising hydrogen to flatten an unpolished surface of the non-porous monocrystalline semiconductor layer.

110. The process according to claim 109, wherein the heat treatment reduces the difference in height of the surface to 2 nm or less.

111. The process according to claim 109, wherein the heat treatment is carried out at a pressure not higher than atmospheric pressure.

112. The process according to claim 111, wherein the heat treatment is carried out at a pressure not higher than 200 Torr.

113. The process according to claim 109, wherein the heat treatment is carried out at a temperature of 300° C. or higher.

114. The process according to claim 113, wherein the heat treatment is carried out at a temperature of 500° C. or higher.

115. The process according to claim 109, wherein the heat treatment is carried out at a temperature of 1200° C. or lower.

116. The process according to claim 109, wherein the porous monocrystalline semiconductor layer and the non-porous monocrystalline semiconductor layer each comprise silicon.

117. A process for producing a semiconductor substrate comprising the steps of:

providing a first substrate having a porous monocrystalline semiconductor layer and a non-porous monocrystalline semiconductor layer;

heat-treating the first substrate at a temperature lower than the melting point of the non-porous monocrystalline semiconductor layer in a hydrogen atmosphere or a reducing atmosphere comprising hydrogen to flatten an unpolished surface of the non-porous monocrystalline semiconductor layer;

then bonding the first substrate to a second substrate with an insulating layer therebetween to obtain a multi-layer structure member such that the non-porous monocrystalline semiconductor layer is positioned inside of the multi-layer structure member; and removing the porous monocrystalline semiconductor layer from the multi-layer structure member.

118. The process according to claim 117, wherein the second substrate comprises silicon.

119. The process according to claim 117, wherein the second substrate and the insulating layer are formed by oxidizing a surface of a silicon substrate.

120. The process according to claim 117, wherein the first substrate and the insulating layer are formed by oxidizing a surface of a non-porous monocrystalline semiconductor layer of a substrate having a porous monocrystalline semiconductor layer and the non-porous monocrystalline semiconductor layer.

121. The process according to claim 117, wherein the insulating layer comprises a first insulating layer and a second insulating layer, wherein the first substrate and the first insulating layer are formed by oxidizing a surface of a non-porous monocrystalline semiconductor layer of a substrate having a porous monocrystalline semiconductor layer and the non-porous monocrystalline semiconductor layer, and wherein the second substrate and the second insulating layer are formed by oxidizing a surface of a silicon substrate.

122. A process for producing a semiconductor substrate comprising the steps of:

providing a first substrate having a porous monocrystalline semiconductor layer and a non-porous monocrystalline semiconductor layer;

heat-treating the first substrate at a temperature lower than the melting point of the non-porous monocrystalline semiconductor layer in a hydrogen atmosphere or a reducing atmosphere comprising hydrogen to flatten an unpolished surface of the non-porous monocrystalline semiconductor layer;

then bonding the first substrate to a light transmitting second substrate to obtain a multi-layer structure member such that the non-porous monocrystalline semiconductor layer is positioned inside of the multi-layer structure member; and removing the porous monocrystalline semiconductor layer from the multi-layer structure member.

123. The process according to claim 122, wherein the second substrate comprises quartz.

124. The process according to claim 122, wherein the second substrate comprises glass.

125. The process according to claim 117 or 122, wherein the porous monocrystalline semiconductor layer and the non-porous monocrystalline semiconductor layer each comprise silicon.

126. The process according to claim 117 or 122, wherein the non-porous monocrystalline semiconductor layer has a thickness of 50 $\mu$m or less.

127. The process according to claim 117 or 122, wherein the step of bonding comprises heat treatment in oxygen atmosphere or nitrogen atmosphere.

128. The process according to claim 117 or 122, wherein the non-porous monocrystalline semiconductor layer is formed by epitaxial growth on the porous monocrystalline semiconductor layer.

129. The process according to claim 128, wherein the non-porous monocrystalline semiconductor layer is formed by a method selected from molecular beam epitaxy, plasma chemical vapor deposition, thermal chemical vapor deposition, photo chemical vapor deposition, bias sputtering, and liquid phase growth.

130. The process according to claim 117 or 122, wherein the porous monocrystalline semiconductor layer of the first substrate is formed by porousifying at least a part of a substrate comprising non-porous monocrystalline semiconductor.

131. The process according to claim 130, wherein the porous monocrystalline semiconductor layer of the first substrate is formed by partly porousifying a substrate comprising non-porous monocrystalline semiconductor and after the bonding step and before the removal of the porous monocrystalline semiconductor layer, removing a region remaining non-porous of the first substrate.

132. The process according to claim 131, wherein the region remaining non-porous of the first substrate is removed by polishing or grinding.

133. The process according to claim 131, wherein the first substrate is formed by providing a silicon substrate having one side surface of n-type and the other side surface of p-type and by porousifying the p-type surface region of the silicon substrate.

134. The process according to claim 130, wherein the porousification is carried out by anodization.

135. The process according to claim 117 or 122, wherein prior to the heat treatment of the first substrate, a surface of the non-porous monocrystalline semiconductor layer is cleaned with hydrofluoric acid.

136. The process according to claim 117 or 122, further comprising after the removal of the porous monocrystalline semiconductor layer, epitaxially growing a monocrystalline semiconductor layer on the non-porous monocrystalline semiconductor layer on the second substrate.

137. The process according to claim 117 or 122, the removal of the porous monocrystalline semiconductor layer is carried out by etching.

138. The process according to claim 137, wherein the etching is carried out using an aqueous solution containing hydrofluoric acid as an etchant.

139. The process according to claim 117 or 122, wherein the heat treatment reduces the difference in height of the surface to 2 nm or less.

140. The process according to claim 117 or 122, wherein the heat treatment is carried out at a pressure not higher than atmospheric pressure.

141. The process according to claim 140, wherein the heat treatment is carried out at a pressure not higher than 200 Torr.

142. The process according to claim 117 or 122, wherein the heat treatment is carried out at a temperature of 300° C. or higher.

143. The process according to claim 142, wherein the heat treatment is carried out at a temperature of 500° C. or higher.

144. The process according to claim 117 or 122, wherein the heat treatment is carried out at a temperature of 1200° C. or lower.

145. A process for producing a semiconductor substrate comprising the steps of:
    providing a first substrate having a porous monocrystalline semiconductor layer and a non-porous monocrystalline semiconductor layer;
    bonding the first substrate to a second substrate with an insulating layer therebetween to obtain a multi-layer structure member such that the non-porous monocrystalline semiconductor layer is positioned inside of the multi-layer structure member;
    removing the porous monocrystalline semiconductor layer from the multi-layer structure member; and
    then heat-treating the non-porous monocrystalline semiconductor layer on the second substrate with the insulating layer therebetween at a temperature lower than the melting point of the non-porous monocrystalline semiconductor layer in a hydrogen atmosphere or a reducing atmosphere comprising hydrogen to flatten an unpolished surface of the non-porous monocrystalline semiconductor layer.

146. The process according to claim 145, wherein the second substrate comprises silicon.

147. The process according to claim 145, wherein the second substrate and the insulating layer are formed by oxidizing a surface of a silicon substrate.

148. The process according to claim 145, wherein the first substrate and the insulating layer are formed by oxidizing a surface of a non-porous monocrystalline semiconductor layer of a substrate having a porous monocrystalline semiconductor layer and the non-porous monocrystalline semiconductor layer.

149. The process according to claim 145, wherein the insulating layer comprises a first insulating layer and a second insulating layer, wherein the first substrate and the first insulating layer are formed by oxidizing a surface of a non-porous monocrystalline semiconductor layer of a substrate having a porous monocrystalline semiconductor layer and the non-porous monocrystalline semiconductor layer, and wherein the second substrate and the second insulating layer are formed by oxidizing a surface of a silicon substrate.

150. A process for producing a semiconductor substrate comprising the steps of:
    providing a first substrate having a porous monocrystalline semiconductor layer and a non-porous monocrystalline semiconductor layer;
    bonding the first substrate to a light transmitting second substrate to obtain a multi-layer structure member such that the non-porous monocrystalline semiconductor layer is positioned inside of the multi-layer structure member;
    removing the porous monocrystalline semiconductor layer from the multi-layer structure member; and
    then heat-treating the non-porous monocrystalline semiconductor layer on the light-transmitting second substrate at a temperature lower than the melting point of the non-porous monocrystalline semiconductor layer in a hydrogen atmosphere or a reducing atmosphere comprising hydrogen to flatten an unpolished surface of the non-porous monocrystalline semiconductor layer.

151. The process according to claim 150, wherein the second substrate comprises quartz.

152. The process according to claim 150, wherein the second substrate comprises glass.

153. The process according to claim 145 or 150, wherein the heat treatment reduces the difference in height of the surface to 2 nm or less.

154. The process according to claim 150, wherein the heat treatment is carried out at a pressure not higher than atmospheric pressure.

155. The process according to claim 150, wherein the heat treatment is carried out at a pressure not higher than 200 Torr.

156. The process according to claim 150, wherein the heat treatment is carried out at a temperature of 300° C. or higher.

157. The process according to claim 150, wherein the heat treatment is carried out at a temperature of 500° C. or higher.

158. The process according to claim 150, wherein the heat treatment is carried out at a temperature of 1200° C. or lower.

159. The process according to claim 145 or 150, wherein the porous monocrystalline semiconductor layer and the non-porous monocrystalline semiconductor layer each comprise silicon.

160. The process according to claim 145 or 150, wherein the non-porous monocrystalline semiconductor layer has a thickness of 50 μm or less.

161. The process according to claim 145 or 150, wherein the step of bonding comprises heat treatment in oxygen atmosphere or nitrogen atmosphere.

162. The process according to claim 145 or 150, wherein the non-porous monocrystalline semiconductor layer is formed by epitaxial growth on the porous monocrystalline semiconductor layer.

163. The process according to claim 162, wherein the non-porous monocrystalline semiconductor layer is formed by a method selected from molecular beam epitaxy, plasma chemical vapor deposition, thermal chemical vapor deposition, photo chemical vapor deposition, bias sputtering, and liquid phase growth.

164. The process according to claim 145 or 150, wherein the porous monocrystalline semiconductor layer of the first substrate is formed by porousifying at least a part of a substrate comprising non-porous monocrystalline semiconductor.

165. The process according to claim 164, wherein the porous monocrystalline semiconductor layer of the first substrate is formed by partly porousifying a substrate comprising non-porous monocrystalline semiconductor and after the bonding step and before the removal of the porous monocrystalline semiconductor layer, removing a region remaining non-porous of the first substrate.

166. The process according to claim 165, wherein the region remaining non-porous of the first substrate is removed by polishing or grinding.

167. The process according to claim 166, wherein the first substrate is formed by providing a silicon substrate having one side surface of n-type and the other side surface of p-type and by porousifying the p-type surface region of the silicon substrate.

168. The process according to claim 164, wherein the porousification is carried out by anodization.

169. The process according to claim 145 or 150, wherein prior to the heat treatment of the first substrate, a surface of the non-porous monocrystalline semiconductor layer is cleaned with hydrofluoric acid.

170. The process according to claim 145 or 150, further comprising after the removal of the porous monocrystalline semiconductor layer, epitaxially growing a monocrystalline semiconductor layer on the non-porous monocrystalline semiconductor layer on the second substrate.

171. The process according to claim 145 or 150, the removal of the porous monocrystalline semiconductor layer is carried out by etching.

172. The process according to claim 171, wherein the etching is carried out using an aqueous solution containing hydrofluoric acid as an etchant.

173. A process for producing a semiconductor substrate comprising the steps of:

providing a first substrate having a nonporous monocrystalline layer on a support substrate;

bonding the first substrate to a second substrate such that the non-porous monocrystalline layer is positioned inside;

removing the support substrate on the nonporous monocrystalline layer bonded to the second substrate; and then heat-treating the non-porous monocrystalline layer bonded to the second substrate at a temperature lower than the melting point of the non-porous monocrystalline layer in a hydrogen atmosphere or a reducing atmosphere comprising hydrogen to flatten an unpolished, exposed surface of the non-porous monocrystalline layer bonded to the second substrate.

174. A process for producing a semiconductor substrate comprising the steps of:

providing a first substrate having a nonporous monocrystalline layer provided on a porous layer on a non-porous monocrystalline region;

bonding the first substrate to a second substrate such that the non-porous monocrystalline layer is positioned inside;

removing the porous layer and the non-porous monocrystalline region on the non-porous monocrystalline layer bonded to the second substrate; and then heat-treating the non-porous monocrystalline layer bonded to the second substrate at a temperature lower than the melting point of the non-porous monocrystalline layer in a hydrogen atmosphere or a reducing atmosphere comprising hydrogen;

whereby a flattened, exposed and unpolished surface of the non-porous monocrystalline layer bonded to the second substrate is obtained.

175. The process according to claim 174, wherein the step of bonding is carried out with an insulating layer formed on a surface of the non-porous monocrystalline layer therebetween.

* * * * *

UNITED STATES PATENT AND TRADEMARK OFFICE
CERTIFICATE OF CORRECTION

PATENT NO.   : 6,121,117
DATED        : September 19, 2000
INVENTOR(S)  : NOBUHIKO SATO ET AL.

Page 1 of 6

It is certified that error appears in the above-identified patent and that said Letters Patent is hereby corrected as shown below:

ON COVER PAGE [56] REFERENCES CITED, U.S. PATENT DOCUMENTS

"4,601,779   7/1986   Abernathy et al." should read
--4,601,779   7/1986 Abernathey et al.--;
"4,649,627   3/1987   Abernethy et al." should read
--4,649,627   3/1987 Abernathey et al.--.

ON COVER PAGE AT [56] OTHER PUBLICATIONS

Line 14, "Structure" should read --"Structure--;
Line 15, "Effect," should read --Effect,"--;
Line 41, "Single" should read --"Single--;
Line 42, "lators," should read --lators,"--.

COLUMN 1

Line 22, "in of" should read --in--.

COLUMN 3

Line 8, "does not relates" should read --does not relate--;
Line 13, "involve" should read --involves--;
Line 21, "the a" should read --the--;
Line 34, "defects is" should read --defects are--.

COLUMN 4

Line 44, "method (2)" should read --methods (1) and (2)--.

UNITED STATES PATENT AND TRADEMARK OFFICE
CERTIFICATE OF CORRECTION

PATENT NO. : 6,121,117

DATED : September 19, 2000

INVENTOR(S) : NOBUHIKO SATO ET AL.

It is certified that error appears in the above-identified patent and that said Letters Patent is hereby corrected as shown below:

COLUMN 5

Line 13, "disadvantage" should read --the disadvantage--;
   Line 31, "have" should read --has--.

COLUMN 6

Line 21, "EMBODIMENT" should read --EMBODIMENTS--.

COLUMN 7

Line 5, "like as" should read --such as--;
   Line 34, "substrate-is" should read --substrate is--.

COLUMN 9

Line 43, "method." should read --methods.--;
   Line 64, "peelled" should read --peeled--.

COLUMN 11

Line 58, "insulating" should read --an insulating--.

COLUMN 14

Line 24, "layers the" should read --layer on the--;
   Line 26, "as an" should read --as the--;
   Line 29, "insulting" should read --insulating--; and "and thin" should read --and a thin--.

UNITED STATES PATENT AND TRADEMARK OFFICE
CERTIFICATE OF CORRECTION

PATENT NO. : 6,121,117
DATED : September 19, 2000
INVENTOR(S) : NOBUHIKO SATO ET AL.

It is certified that error appears in the above-identified patent and that said Letters Patent is hereby corrected as shown below:

COLUMN 15

Line 50, "the results." should read --a result,--;
Line 58, "disappears" should read --disappeared--.

COLUMN 16

Line 52, "layer made" should read --layer is made--.

COLUMN 18

Line 62, "4 inch" (second occurrence) should be deleted.

COLUMN 20

Line 39, "entire of the" should read --entire--.

COLUMN 23

Line 17, "selectively-etched" should read --selectively etched--.

COLUMN 25

Line 48, "entire of the" should read --entire--.

COLUMN 26

Line 28, "entire of the" should read --entire--.

UNITED STATES PATENT AND TRADEMARK OFFICE
CERTIFICATE OF CORRECTION

PATENT NO. : 6,121,117
DATED : September 19, 2000
INVENTOR(S) : NOBUHIKO SATO ET AL.

It is certified that error appears in the above-identified patent and that said Letters Patent is hereby corrected as shown below:

COLUMN 28

Line 22, "consequently," should read --¶ Consequently,--;
  Line 39, "-porous" should read --porous--.

COLUMN 30

Line 4, "entire of the" should read --entire--;
  Line 7, "porous with the" should read --porous as described before, and the--;
  Line 53, "entire of the" should read --entire--.

COLUMN 31

Line 25, "entire of the" should read --entire--;
  Line 62, "entire of the" should read --entire--.

COLUMN 33

Line 9, "entire of the" should read --entire--;
  Line 54, "entire of the" should read --entire--.

COLUMN 34

Line 27, "entire of the" should read --entire--;
  Line 66, "entire of the" should read --entire--.

COLUMN 35

Line 35, "entire of the" should read --entire--.

UNITED STATES PATENT AND TRADEMARK OFFICE
CERTIFICATE OF CORRECTION

PATENT NO. : 6,121,117
DATED : September 19, 2000
INVENTOR(S) : NOBUHIKO SATO ET AL.

Page 5 of 6

It is certified that error appears in the above-identified patent and that said Letters Patent is hereby corrected as shown below:

COLUMN 36

Line 50, "entire of the" should read --entire--.

COLUMN 40

Line 13, "14, the" should read --"14, wherein the--.

COLUMN 41

Line 30, "32 or 42," should read --37 or 42,--.

COLUMN 42

Line 28, "42, the" should read --42, wherein the --.

COLUMN 43

Line 44, "65, the" should read --65, wherein the--.

COLUMN 44

Line 51, "85, the" should read --85, wherein the--.

COLUMN 45

Line 4, "nonporous" should read --non-porous--;
Line 15, "nonporous" should read --non-porous--.

UNITED STATES PATENT AND TRADEMARK OFFICE
CERTIFICATE OF CORRECTION

PATENT NO. : 6,121,117
DATED : September 19, 2000
INVENTOR(S) : NOBUHIKO SATO ET AL.

It is certified that error appears in the above-identified patent and that said Letters Patent is hereby corrected as shown below:

COLUMN 47

Line 29, "claim 131," should read --claim 130,--;
   Line 45, "122, the" should read --122, wherein the--.

COLUMN 50

Line 8, "150, the" should read --150, wherein the--;
   Line 17, "nonporous" should read --non-porous--;
   Line 22, "nonporous" should read --non-porous--;
   Line 34, "nonporous" should read --non-porous--.

Signed and Sealed this

Twenty-second Day of May, 2001

Attest:

NICHOLAS P. GODICI

*Attesting Officer*     Acting Director of the United States Patent and Trademark Office